United States Patent
Kirsch et al.

(10) Patent No.: US 12,046,269 B2
(45) Date of Patent: Jul. 23, 2024

(54) TWO BIT MEMORY DEVICE AND METHOD FOR OPERATING THE TWO-BIT MEMORY DEVICE AND ELECTRONIC COMPONENT

(71) Applicant: MERCK PATENT GMBH, Darmstadt (DE)

(72) Inventors: Peer Kirsch, Darmstadt (DE); Sebastian Resch, Darmstadt (DE); Henning Seim, Darmstadt (DE); Itai Lieberman, Darmstadt (DE); Marc Tornow, Munich (DE); Julian Dlugosch, Munich (DE); Takuya Kamiyama, Munich (DE)

(73) Assignee: MERCK PATENT GMBH, Darmstadt (DE)

( * ) Notice: Subject to any disclaimer, the term of this patent is extended or adjusted under 35 U.S.C. 154(b) by 158 days.

(21) Appl. No.: 17/771,200

(22) PCT Filed: Oct. 20, 2020

(86) PCT No.: PCT/EP2020/079449
§ 371 (c)(1),
(2) Date: Apr. 22, 2022

(87) PCT Pub. No.: WO2021/078714
PCT Pub. Date: Apr. 29, 2021

(65) Prior Publication Data
US 2022/0383924 A1   Dec. 1, 2022

(30) Foreign Application Priority Data
Oct. 23, 2019 (EP) .................................... 19204840

(51) Int. Cl.
*G11C 11/16* (2006.01)
*H10K 30/00* (2023.01)
(Continued)

(52) U.S. Cl.
CPC ........ *G11C 11/161* (2013.01); *G11C 11/1659* (2013.01); *G11C 11/1673* (2013.01);
(Continued)

(58) Field of Classification Search
CPC .............. G11C 11/161; G11C 11/1659; G11C 11/1673; G11C 11/1675; H10K 30/67; H10K 85/40
See application file for complete search history.

(56) References Cited

U.S. PATENT DOCUMENTS

| 9,966,458 B2 | 5/2018 | Göhler et al. |
| 11,063,227 B2 | 7/2021 | Kirsch et al. |

(Continued)

FOREIGN PATENT DOCUMENTS

| DE | 102017005884 A1 | 1/2018 |
| EP | 2492984 B1 | 5/2019 |

OTHER PUBLICATIONS

NPL J. of Physical Chemistry letters, vol. Issue 16, 2012 pp. 2114-2309, Naaman, et al. (Year: 2012).*

(Continued)

*Primary Examiner* — Min Huang
(74) *Attorney, Agent, or Firm* — MILLEN, WHITE, ZELANO & BRANIGAN, P.C.; Csaba Henter

(57) ABSTRACT

A two-bit memory device having a layer structure containing in order a bottom layer, a molecular layer containing a chiral compound having at least one polar functional group, and a top layer, which is electrically conductive and ferromagnetic. The chiral compound acts as a spin filter for electrons passing through the molecular layer. The chiral compound is of flexible conformation and has a conformation-flexible molecular dipole moment. An electrical resistance of the layer structure for an electrical current running from the bottom layer to the top layer has at least four distinct states (Continued)

which depend on the magnetization of the top layer and on the orientation of the conformation-flexible dipole moment of the chiral compound. Furthermore, a method for operating the two-bit memory device and an electronic component containing at least one two-bit memory device.

20 Claims, 3 Drawing Sheets

(51) Int. Cl.
*H10K 85/40* (2023.01)
*H10K 102/00* (2023.01)
*H10K 102/10* (2023.01)

(52) U.S. Cl.
CPC ........ *G11C 11/1675* (2013.01); *H10K 30/671* (2023.02); *H10K 85/40* (2023.02); *H10K 2102/00* (2023.02); *H10K 2102/103* (2023.02)

(56) References Cited

U.S. PATENT DOCUMENTS

| | | | |
|---|---|---|---|
| 2015/0049542 A1* | 2/2015 | Naaman | H03K 19/0008 365/158 |
| 2017/0162250 A1 | 6/2017 | Slesazeck et al. | |
| 2019/0035449 A1* | 1/2019 | Saida | G06N 3/084 |
| 2019/0386202 A1* | 12/2019 | Gosavi | H10N 50/10 |
| 2021/0175439 A1* | 6/2021 | Beard | C07C 211/65 |
| 2022/0328757 A1* | 10/2022 | Pereira de Sousa | G11C 11/161 |
| 2022/0359617 A1* | 11/2022 | Woo | G11C 11/1675 |

OTHER PUBLICATIONS

Annu. Rev. Phys. Chem. 2015. 66:263-81, Naaman et al. (Year: 2015).*
International search report PCT/EP2020/079449 dated Dec. 16, 2020 (pp. 1-3).
Naaman et al: "Spintronics and Chirality: Spin Selectivity in Electron Transport Through Chiral Molecules", Annual Review of Physical Chemistry 2015, 66, 1, 274-278.
Waldeck, "Chiral-Induced Spin Selectivity Effect" J. Phys. Chem. Lett. 2012, 3, 2178-2187.

* cited by examiner

TWO BIT MEMORY DEVICE AND METHOD FOR OPERATING THE TWO-BIT MEMORY DEVICE AND ELECTRONIC COMPONENT

The invention relates to a two-bit memory device having a layer structure, the layer structure comprising in this order a bottom layer, a molecular layer and top layer. Further aspects of the invention relate to a method for operating the two-bit memory device and an electronic component comprising at least one two-bit memory device.

In computer technology, storage media are required which allow rapid writing and reading access to information stored therein. Solid-state memories or semiconductor memories allow particularly fast and reliable storage media to be achieved, since absolutely no moving parts are necessary. At present, use is mainly made of dynamic random access memory (DRAM). DRAM allows rapid access to the stored information, but this information has to be refreshed regularly, meaning that the stored information is lost when the power supply is switched off.

The prior art also discloses non-volatile semiconductor memories, such as flash memory or magnetoresistive random access memory (MRAM), in which the information is retained even after the power supply has been switched off. A disadvantage of flash memory is that writing access takes place comparatively slowly and the memory cells of the flash memory cannot be erased ad infinitum. The lifetime of flash memory is typically limited to a maximum of one million read/write cycles. MRAM can be used in a similar way to DRAM and has a long lifetime, but this type of memory has not been able to establish itself owing to the difficult production process.

A further alternative is memory which works on the basis of memristors. The term memristor is a contraction of the words "memory" and "resistor" and denotes a component which is able to change its electrical resistance reproducibly between a high and a low electrical resistance. The respective state (high resistance or low resistance) is retained even without a supply voltage, meaning that non-volatile memories can be achieved with memristors.

The article "Chiral-Induced Spin Selectivity Effect" by David H. Waldeck, J. Phys. Chem. Lett. 2012, 3, 2178-2187 describes the recently experimentally and theoretically established chiral-induced spin selectivity (CISS) effect. Experiments have shown that ordered films of chiral organic molecules on surfaces can act as electron spin filters at room temperature. Further, a memory device is suggested which comprises a ferromagnetic nano-object placed between two electrodes and is connected to the electrodes by chiral molecules having all the same handedness. When a charge is flowing through the electrodes, the chiral molecules and the nano-object, the preferred spin will be transmitted and can be used to induce magnetization of the nano-object. Because the preferred orientation of the spin depends on the direction of charge flow, the direction of the magnetization depends on the direction of the current. After magnetization of the nano-object, a small current flowing in the same direction will have a high resistance while a small current flowing in the opposite direction will have a lower resistance because its spin will correspond to the minority spin in the nano-object.

EP 2 492 984 A2 discloses a spin filter device comprising a substrate and at least one monolayer comprising chiral molecules. The chiral molecules act as spin filter which allow electrons that exhibit a predetermined spin to pass. In one embodiment, the device has a first substrate, a monolayer of asymmetric molecules and a second substrate. The first substrate may be made of a metal or a semiconductor and acts as source material. The second substrate acts as target material. Electrons travel from the first substrate into the monolayer. The majority of the electrons which have passed the monolayer have the same spin. These spin filtered electrons are injected into the second substrate.

US 2015/049542 A1 discloses a spin selective device. The device comprises a first layer comprising a ferromagnetic material and a second layer coupled to the first layer. The second layer includes at least one molecule having a specified chirality, such that when an electrical current flows between the first layer and the second layer one or more regions of the ferromagnetic material become magnetically polarized along a certain direction. Further, memory and/or logic devices comprising such a spin selective device are disclosed. The second layer serves as spin injector and provides a spin polarized current. For injecting a polarized current having a first spin polarization, chiral molecules having a first chirality are provided and for injecting a polarized current having a second spin polarization, chiral molecules having a second chirality are provided. The chirality of the molecules is fixed and is not changed during operation of the spin selective device.

DE 10 2017 005 884 A1 discloses an electronic switching element which comprises in this order a first electrode, a molecular layer bonded to a substrate and a second electrode. The molecular layer consists essentially of compounds in which a mesogenic radical is bound to the substrate via a spacer group by means of an anchor group. The resistance of the molecular layer may be switched between a high resistance state and a low resistance state by applying an electrical potential exceeding a switching voltage.

In order to reduce the required area for a flash memory storage cell, multi-level cell (MLC) technology is used, wherein a single storage cell stores more than one bit. However, this multi-level cell approach cannot be applied to fast switching non-volatile magnetic memory technologies such as MRAM, spin torque transfer magnetoresistive random access memory (STT MRAM), or spin-orbit torque transfer magnetoresistive random access memory (SOT MRAM).

There is a need for compact and energy-efficient memory devices providing non-volatile and fast-switching memory.

A two-bit memory device having a layer structure is proposed. The layer structure comprises in this order a bottom layer (A), a molecular layer (C) comprising a chiral compound having at least one polar functional group, and a top layer (E).

The top layer (E) is electrically conductive and ferromagnetic. The chiral compound of the molecular layer (C) acts as a spin filter for electrons passing through the molecular layer (C). The chiral compound is of flexible conformation and has a conformation-flexible molecular dipole moment.

An electrical resistance of the layer structure for an electrical current running from the bottom layer (A) to the top layer (E) has at least four distinct states which depend on the magnetization of the top layer (E) and on the orientation of the conformation-flexible dipole moment of the chiral compound of the molecular layer (C).

The four distinct states of the electrical resistance of the layer structure may be used to encode two bits of information, wherein each bit may have either one of the states "0" or "1". For example, the two states of the molecular layer (C) may encode the state of a first bit and the two states of the top layer (E) may encode the state of a second bit.

The state of the proposed two-bit memory device is non-volatile meaning that no refresh cycle or supply voltage is required to retain the state and thus the encoded information.

The electrical resistance of the molecular layer (C) is dependent on the orientation of the at least one polar functional group of the chiral compound. The at least two resistance states of the molecular layer (C) are addressable by conformational dipole reorganization of the at least one polar functional group of the chiral compound. This may be achieved by application of an electric field. This is referred to as dielectric switching. Switching occurs when an applied voltage is equal to or exceeds a switching voltage.

Likewise, the two resistance states of the top layer (E) are addressable by changing the magnetization of the top layer (E), for example by means of an external magnetic field or preferably by means of the spin-torque effect. This is referred to as magnetic switching. Depending on the magnetization of the top layer (E), a spin polarized current flowing from the molecular layer (C) into the top layer (E) exhibits a low or high resistance.

The molecular layer (C) of the present invention preferably comprises a chiral and enantio-pure, or at least enriched chiral compound. Chiral molecules are non-superimposable on its mirror image. Preferably the molecular layer comprises an organic chiral compound with a conformationally flexible dipole moment, which can be switched along the z-axis, i.e., perpendicularly to the plane of the layer structure.

The chiral compound may comprise a conformationally flexible spacer group which allows the at least one polar group to change its orientation when an electric field is applied. The electrical resistance of the molecular layer (C) depends on the orientation of the orientation of the polar group and may thus be switched by means of an electric field.

The chiral molecules of the molecular layer (C) are used as electron spin filters. When an electrical current flows through the molecular layer (C) in a direction perpendicular to the plane of the layer, the electrons are spin polarized due to the chiral-induced spin selectivity (CISS) effect so that the majority of the electrons have the same spin. Usually, the electron spin of a current is non-polarized meaning that besides statistical fluctuations the number of electrons having the state "spin up" is equal to the number of electrons having the state "spin down". The degree of spin polarization of a current is defined as the quotient between the difference between the current I+ having "spin up" and the current I− having "spin down" and the sum of the currents I+ and I−.

Preferably, the electrical current passing through the molecular layer (C) has a spin polarization of at least 5%, more preferably of at least 10%, most preferably of at least 25%.

The preferred thickness of the molecular layer (C) is 10 nm or less, preferably 5 nm or less, more preferably 2 nm or less.

Preferably, the molecular layer (C) consists only of the chiral component.

Preferably, the molecular layer (C) is an enantiomerically pure layer, but the molecular layer (C) may also consist of a mixture of achiral, racemic and chiral compounds, provided that at least 0.1% of the composition are enantiomerically pure and thus form an enantiomeric excess.

The molecular layer (C) used in accordance with the invention is preferably a molecular monolayer. More preferably, the molecular layer (C) is a self-assembled monolayer (SAM). The production of self-assembled monolayers is known to the expert; an overview is given in, for example, Abraham Ulman, "Formation and Structure of Self-Assembled Monolayers", Chem. Rev. 1996, 96, 1533-1554.

Preferably, the molecular layer (C) is bound to a substrate.

Preferably, the chiral compound of the molecular layer (C) is bound to the bottom layer (A) so that the bottom layer (A) serves as substrate.

Alternatively it is preferred that an anchoring layer (B) for bonding of the chiral compound of the molecular layer (C) is arranged between the bottom layer (A) and that the molecular layer (C) and the chiral compound of the molecular layer (C) is bound to the anchoring layer (B). In this case, the anchoring layer (B) serves as substrate.

The anchoring layer (B) is preferably a thin layer of an electrically conducting material. Alternatively, the anchoring layer (B) may be selected from a thin layer of an electrically insulating or semiconducting material. In the latter case, the material and thickness of the anchoring layer (B) are chosen such that an electrical current may tunnel through the anchoring layer (B) from the bottom layer (A) into the molecular layer (C).

Preferably, the chiral compound is bound to the substrate by chemisorption, in particular by an addition reaction or condensation reaction.

Alternatively, the chiral compound is bound to the substrate by physisorption.

The chiral compound may comprise an anchoring group for bonding with the substrate.

The degree of coverage of the substrate is preferably 90% or more to 100%, especially preferred 95% or more to 100%, especially preferred 98% or more to 100%.

Optionally, an interlayer (D) is arranged between the molecular (C) and the top layer (E). The interlayer (D) may be used to provide a protection layer for the molecular layer (C). For example, a thin interlayer may protect the molecular layer (C) and in particular the chiral compound when the top layer (E) is produced by a deposition method such as, for example, physical or chemical vapor deposition.

Additionally or alternatively, the interlayer (D) may be used for adjusting electrical properties of the layer structure. For example, a very thin layer having a thickness of typically around 2 nm may be provided to reduce leakage currents or avoid short circuits while still allowing electrons to tunnel through the interlayer (D). This may improve the reliability of the two-bit memory device.

Still further, the interlayer (D) may serve as an adhesion-promoting interlayer in order to improve the reliability of the two-bit memory device, in particular with respect to thermal stress during the manufacturing process.

Preferably, the material of the anchoring layer (B) and/or of the interlayer (D) is chosen from the group comprising $Al_2O_3$, $ZrO_2$, $HfO_2$, $TiO_2$, $SiO_2$, ITO, AZO, IGZO, ZnO, MgO and combinations thereof.

The materials of the anchoring layer (B) and of the interlayer (D) may be chosen independently from each other.

Especially in case an electrically insulating material is chosen for the anchoring layer (B) and/or the interlayer (D), it is preferred to use a thin layer. Preferably, the thickness is chosen in the range of from 0.1 nm to 10 nm. Such a thin layer allows electrons to tunnel through the anchoring layer (B) and/or the interlayer (D) so that a tunnel current may flow.

The bottom layer (A) of the layer structure provides an electrical contact of the layer structure and may also serve as substrate for the molecular layer (C) in case no anchoring layer (B) is used.

Preferably, the material of the bottom layer (A) is chosen from the group comprising doped Si, Al, W, Mo, Ru, Ag, Au, TiN, TaN and combinations thereof.

The top layer (E) of the layer structure is electrically conductive and ferromagnetic. Preferably, the top layer (E) is a soft magnetic layer. Soft magnetic layers are easy to magnetize and have a low coercivity compared to hard magnetic layers.

Preferably, the material of the top layer (E) is chosen from the group comprising Ni, Co, Fe, NiFe, CoFeB, CoFe, GdFe, TbFeCo, GdFeCo and combinations thereof.

Preferably, the quotient between a difference between the electrical resistances of the two states of the molecular layer (C) and a difference between the two states of the top layer (E) is in the range of from 10 to 10000.

Preferably, the quotient between a difference between a high electrical resistance state and a low electrical resistance state of the molecular layer (C) is in the range of from 20 to 1000, especially preferably in the range of from 100 to 500.

Preferably, the quotient between a difference between a high electrical resistance state and a low electrical resistance state of the top layer (E) is in the range of from 2 to 10, especially preferably in the range of from 5 to 10.

In a first embodiment of the two-bit memory device the bottom layer (A) is configured as a bottom electrode or is connected to a bottom electrode and the top layer is connected to a top electrode. For switching of the molecular layer (C) into a first state of electrical resistance or a second state of electrical resistance, a first switching voltage or second switching voltage, respectively, is applied between the bottom layer (A) and the top layer (E) and for switching of the top layer (E) into a first state of electrical resistance or a second state of electrical resistance, a third switching voltage or fourth switching voltage, respectively, is applied between the bottom layer (A) and the top layer (E), wherein the absolute values of the third and fourth switching voltage are at least two times larger than the absolute values of the first switching voltage and the second switching voltage. The magnetic switching of the top layer (E) is inter alia dependent on the spin polarization of the current provided by the molecular layer (C) and the magnetic properties, especially the coercivity of the top layer (E). Accordingly, the third and fourth switching voltage may be adjusted by choosing the materials of the molecular layer (C) and the top layer (E).

The third and fourth switching voltage must differ from the first and second switching voltages in order to address the magnetic switching and dielectric switching independently.

Preferably, the bottom electrode comprises exactly one electrical contact for applying the switching voltages and for applying a reading current.

The dielectric switching of the molecular layer (C) is inter alia dependent on the used chiral compound and an electric field generated by the applied voltage. Accordingly, the required first and second switching voltages are inter alia dependent on the thickness of the molecular layer (C) and the chiral compound. These parameters are adjusted so that the first and second switching voltages are lower than a dielectric breakdown voltage of the molecular layer (C).

In this first embodiment, the magnetic switching of the top layer (E) is performed by means of spin-torque transfer using a spin polarized electric current. The current is being spin polarized by means of the CISS effect using the chiral compound of the molecular layer (C). The magnetic switching of the top layer (E) is inter alia dependent on the magnetic properties of the used material, the electrical current flowing when the third or fourth switching voltage is applied and the degree of spin polarization of the current.

Accordingly, the third and fourth switching voltages are dependent on the material of the top layer (E), the chiral compound and the overall electrical resistance of the layer structure.

In a second embodiment, the bottom layer (A) is configured as a bottom electrode or is contacted by a bottom electrode and the bottom electrode is contacted by a first electrical contact and additionally by a second electrical contact and forms an electrical conductor being arranged parallel to the top layer (E) and the first and second electrical contacts are arranged such that an electrical current flows through the electrical conductor when a third switching voltage or fourth switching voltage, respectively, is applied between the first and second electrical contacts.

In this second embodiment, the dielectric switching is performed identical to the first embodiment. However, magnetic switching of the top layer (E) is performed using an external magnetic field generated by the current flowing through the electrical conductor which is arranged parallel to the top layer (E). The magnetic switching and thus the third and fourth switching voltages are inter alia dependent on the magnetic properties of the material of the top layer (E), the distance between the top layer (E) and the electrical conductor and the electrical resistance of the electrical conductor.

The material of the top electrode and/or of the bottom electrode is electrically conducting and is preferably selected from a metallic conductor or a semiconductor.

The top electrode and/or the bottom electrode may also be configured as combination (layer stack) of a plurality of materials. The material may be selected from those materials suitable as bottom layer (A). Further suitable examples include Hg, In, Ga, InGa, Ag, Au, Cr, Pt, PdAu, Pb, Al, Mg, TiN, TaN, W, Mo, Ru, CO, Ti, CNT, graphene and conductive polymers (such as PEDOT:PSS).

The proposed two-bit memory device may be arranged on an outer substrate material which can be, for example, a wafer.

The material of the outer substrate may be selected from an element semiconductor, such as silicon (Si), germanium (Ge), carbon in the form of diamond, graphite or graphene, from a compound semiconductor, in particular a II-VI compound semiconductor, such as cadmium selenide (CdSe), zinc sulfide (ZnS), from a metal, such as, for example, gold, silver, copper, aluminium, magnesium, or from a conductive oxidic material, such as indium tin oxide (ITO), indium gallium oxide (IGO), indium gallium zinc oxide (IGZO), aluminium-doped zinc oxide (AZO) or fluorine-doped tin oxide (FTO). Preference is given to the use of crystalline silicon as substrate, where silicon wafers having a (100) surface are particularly preferred. Silicon wafers whose surface is oriented at (100) are employed as conventional substrate in microelectronics and are available in high quality and with a low proportion of surface defects.

Suitable compound semiconductors include
  group III-V semiconductors, such as GaAs, GaP, InP, InSb, InAs, GaSb, GaN, AlN, InN, $Al_xGa_{(1-x)}As$ and $In_xGa_{(1-x)}Ni$,
  group II-VI semiconductors, such as ZnO, ZnS, ZnSe, ZnTe, CdS, CdSe, CdTe, $Hg_{(1-x)}Cd_{(x)}Te$, BeSe, BeTex and HgS,
  group III-VI semiconductors, such as GaS, GaSe, GaTe, InS, $InSe_x$ and InTe,
  group I-III-VI semiconductors, such as $CuInSe_2$, $CuInGaSe_2$, $CuInS_2$ and $CuInGaS_2$, group IV-IV semiconductors, such as SiC and SiGe, and group IV-VI semiconductors, such as SeTe.

The proposed two-bit memory device may be manufactured, for example, by means of common lithography methods known in the microelectronics industry.

The chiral compound of the molecular layer (C) is preferably selected from the group of compounds of the formulae

  (IA)

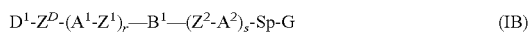  (IB)

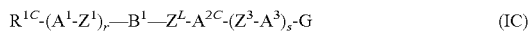  (IC)

in which
R$^1$ denotes straight chain or branched racemic or branched non-racemic alkyl or alkoxy each having up to 20 C atoms, where one or more CH$_2$ groups in these radicals may each be replaced, independently of one another, by —C≡C—, —CH═CH—,

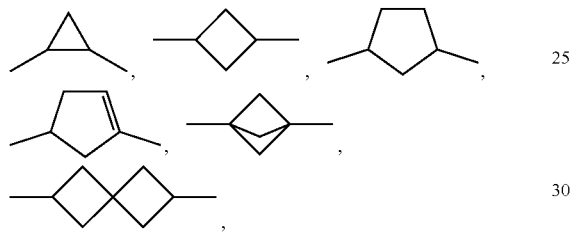

—O—, —S—, —CF$_2$O—, —OCF$_2$—, —CO—O—, —O—CO—, —SiR$^O$R$^{OO}$—, —NH—, —NR$^O$— or —SO$_2$— in such a way that O atoms are not linked directly to one another, and in which one or more H atoms may be replaced by halogen, CN, SCN or SF$_5$, R$^{1C}$ denotes straight chain or branched racemic or branched non-racemic alkyl or alkoxy each having 1 to 20 C atoms, where one or more CH$_2$ groups in these radicals may each be replaced, independently of one another, by —C≡C—, —CH═CH—,

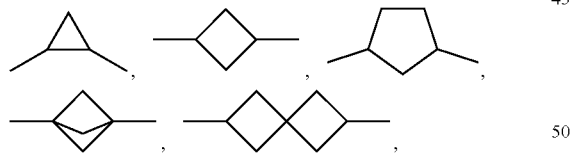

—O—, —S—, —CF$_2$O—, —OCF$_2$—, —CO—O—, —O—CO—, —SiR$^O$R$^{OO}$—, —NH—, —NR$^O$— or —SO$_2$— in such a way that O atoms are not linked directly to one another, and in which one or more H atoms may be replaced by halogen, CN, SCN or SF$_5$, and alternatively denotes a group D$^1$-Z$^D$, Z$^D$ has one of the meanings of Z$^1$, Z$^2$ and Z$^3$ or denotes a spacer group, Z$^1$, Z$^2$, Z$^3$ on each occurrence, identically or differently, denote a single bond, —CF$_2$O—, —OCF$_2$—, —CF$_2$S—, —SCF$_2$—, —CH$_2$O—, —OCH$_2$—, —C(O)O—, —OC(O)—, —C(O)S—, —SC(O)—, —(CH$_2$)$_{n1}$—, —(CF$_2$)$_{n2}$—, —CF$_2$—CH$_2$—, —CH$_2$—CF$_2$—, —CH═CH—, —CF═CF—, —CF═CH—, —CH═CF—, —(CH$_2$)$_{n3}$O—, —O(CH$_2$)$_{n4}$—, —C≡C—, —O—, —S—, —CH═N—, —N═CH—, —N═N—, —N═N(O)—, —N(O)═N— or —N═C—C═N—, n1, n2, n3, n4 identically or differently, are 1, 2, 3, 4, 5, 6, 7, 8, 9 or 10, Z$^L$ denotes —O—, —S—, —CH$_2$—, —C(O)—, —CF$_2$—, —CHF—, —C(R$^x$)$_2$—, —S(O)—, —SO$_2$—, where a group —CHF— or an asymmetrically substituted group —C(R$^x$)$_2$— can be racemic or non-racemic, R$^O$, R$^{OO}$, identically or differently, denote an alkyl or alkoxy radical having 1 to 15 C atoms, in which, in addition, one or more H atoms may be replaced by halogen, R$^x$ on each occurrence, identically or differently, denotes H or straight-chain or branched alkyl having 1 to 6 C atoms, D$^1$ denotes a diamondoid radical, preferably derived from a lower diamondoid, very preferably selected from the group consisting of adamantyl, diamantyl, and triamantyl, in which one or more H atoms can be replaced by F, in each case optionally fluorinated alkyl, alkenyl or alkoxy having up to 12 C atoms, in particular

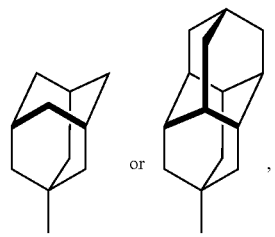

A$^1$, A$^2$, A$^3$ on each occurrence, identically or differently, denote an aromatic, heteroaromatic, alicyclic or heteroaliphatic ring having 4 to 25 ring atoms, which may also contain condensed rings and which may be mono- or polysubstituted by Y, A$^{2C}$ denotes an aromatic or heteroaromatic ring having 5 to 25 ring atoms, which may also contain condensed rings and which may be mono- or polysubstituted by Y$^C$, Y on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, preferably F or Cl, Y$^C$ on each occurrence, identically or differently, denotes F, Cl, CN, SCN, SF$_5$ or straight-chain or branched, in each case optionally fluorinated alkyl, alkoxy, alkylcarbonyl, alkoxycarbonyl, alkylcarbonyloxy or alkoxycarbonyloxy having 1 to 12 C atoms, or cycloalkyl or alkylcycloalkyl each having 3 to 12 C atoms, preferably methyl, ethyl, isopropyl, cylopropyl, cyclobutyl, cyclopentyl, cyclohexyl, trifluoromethyl, methoxy or trifluoromethoxy, B$^1$ denotes

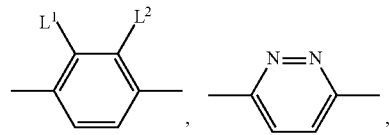

-continued

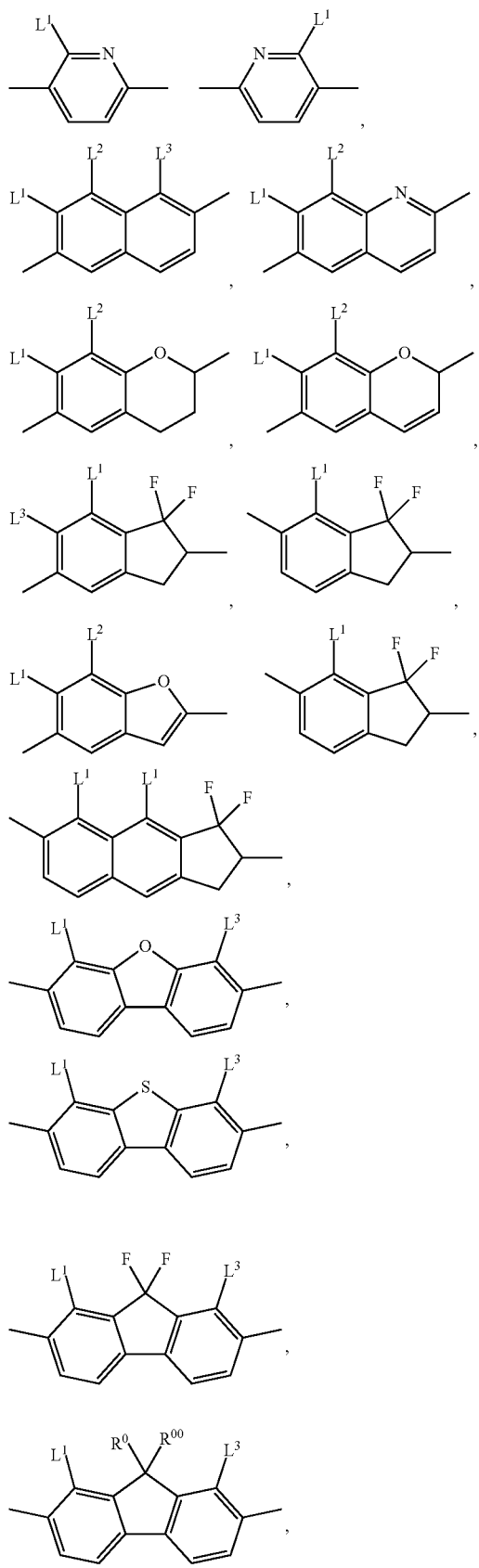

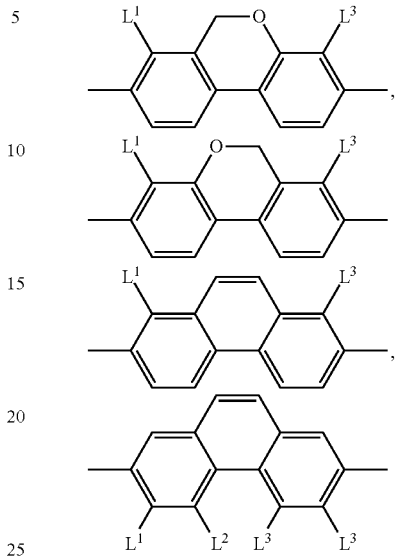

in which $R^O$ and $R^{OO}$, identically or differently, denote alkyl having 1 to 6 C atoms, where the groups may be oriented in both directions,
$L^1$ to $L^3$, independently of one another, denote F, Cl, Br, I, CN, SF$_5$, CF$_3$ or OCF$_3$, preferably CF$_3$, Cl or F, where $L^3$ may alternatively also denote H,
Sp$^A$ denotes a spacer group or a single bond,
Sp denotes a chiral spacer group,
G denotes —OH, —CH(CH$_2$OH)$_2$, —C(CH$_2$OH)$_3$, —SH, —SO$_2$OH, —OP(O)(OH)$_2$, —PO(OH)$_2$, —C(OH)(PO(OH)$_2$)$_2$, —COOH, —Si(OR$^x$)$_3$ or —SiCl$_3$, —SO$_2$OR$^V$, —OP(O)(OR$^V$)$_2$, —PO(OR$^V$)$_2$, —C(OH)(PO(OR$^V$)$_2$)$_2$, —COOR$^V$, —Si(OR$^V$)$_3$, preferably —PO(OH)$_2$ or —C(OH)(PO(OH)$_2$)$_2$, Very preferably —PO(OH)$_2$
$R^V$ denotes secondary or tertiary alkyl having 1 to 20 C atoms, preferably secondary or tertiary alkyl having 3 to 10 C atoms, and
r, s on each occurrence, identically or differently, are 0, 1 or 2,
where at least one of $R^1$ and Sp$^A$ of formula IA is a chiral group, optionally, $Z^D$ of formula IB is a chiral spacer group, and at least one of $R^{1C}$ and $Z^L$ of formula IC is chiral, and wherein $B^1$ is polar.
G may serve as anchoring group for bonding of the compound to a substrate.
The term "diamondoids" refers to substituted and unsubstituted cage compounds of the adamantane series including adamantane, diamantane, triamantane, tetramantanes, pentamantanes, hexamantanes, heptamantanes, octamantanes, and the like, including all isomers and stereoisomers thereof. The compounds have a "diamondoid" topology, which means their carbon atom arrangement is superimposable on a fragment of a face centered cubic diamond lattice. Substituted diamondoids from the first of the series are preferable with 1 to 4 independently-selected alkyl or alkoxy substituents. Diamondoids include "lower diamondoids" and "higher diamondoids," as these terms are defined herein, as well as mixtures of any combination of lower and higher diamondoids. The term "lower diamondoids" refers to adamantane, diamantane and triamantane and any and/or all unsubstituted and substituted derivatives of adamantane, diamantane and triamantane. These lower diamondoid components show no isomers or chirality and are readily synthesized, distinguishing them from "higher diamondoids." The term "higher diamondoids" refers to any and/or all substituted and unsubstituted tetramantane components; to any and/or all substituted and unsubstituted pentamantane components; to any and/or all substituted and unsubstituted hexamantane components; to any and/or all substituted and unsubstituted heptamantane components; to any and/or all substituted and unsubstituted octamantane components; as well as mixtures of the above and isomers and stereoisomers of tetramantane, pentamantane, hexamantane, heptamantane, and octamantane. Adamantane chemistry has been reviewed by Fort, Jr. et al. in "Adamantane: Consequences of the Diamondoid Structure," Chem. Rev. vol. 64, pp. 277-300 (1964). Adamantane is the smallest member of the diamondoid series and may be thought of as a single cage crystalline subunit. Diamantane contains two subunits, triamantane three, tetramantane four, and so on. While there is only one isomeric form of adamantane, diamantane, and triamantane, there are four different isomers of tetramantane, (two of which represent an enantiomeric pair), i.e., four different possible ways or arranging the four adamantane subunits. The number of possible isomers increases non-linearly with each higher member of the diamondoid series, pentamantane, hexamantane, heptamantane, octamantane, etc. Adamantane, which is commercially available, has been studied extensively. The studies have been directed toward a number of areas, such as thermodynamic stability, functionalization, and the properties of adamantane-containing materials. For instance, Schreiber et al., New J. Chem., 2014, 38, 28-41 describes the synthesis and application of functionalized diamondoids to form large area SAMs on silver and gold surfaces. In K. T. Narasimha et al., Nature Nanotechnology 11, March 2016 page 267-273, monolayers of diamondoids are described to effectively confer enhanced field emission properties to metal surfaces due to a significant reduction of the work function of the metal.

As used herein, an anchor group is a functional group by means of which a compound is adsorbed onto or bonded to the surface of the substrate by physisorption, chemisorption or by chemical reaction. This chemical reaction includes the transformation of a precursor of an anchor group in situ, for example on the surface of a substrate or electrode.

A spacer group in the sense of the present invention is a flexible chain between dipolar moiety and anchor group which causes a separation between these sub-structures and, owing to its flexibility, at the same time improves the mobility of the dipolar moiety after bonding to a substrate.

The spacer group can be branched or straight chain. Chiral spacers are branched and optically active, i.e. non racemic.

Herein, alkyl is straight-chain or branched and has 1 to 15 C atoms, is preferably straight-chain and has, unless indicated otherwise, 1, 2, 3, 4, 5, 6 or 7 C atoms and is accordingly preferably methyl, ethyl, propyl, butyl, pentyl, hexyl or heptyl.

Herein, an alkoxy radical is straight-chain or branched and contains 1 to 15 C atoms. It is preferably straight-chain and has, unless indicated otherwise, 1, 2, 3, 4, 5, 6 or 7 C atoms and is accordingly preferably methoxy, ethoxy, propoxy, butoxy, pentoxy, hexoxy or heptoxy.

Herein, an alkenyl radical is preferably an alkenyl radical having 2 to 15 C atoms, which is straight-chain or branched and contains at least one C=C double bond. It is preferably straight-chain and has 2 to 7 C atoms. Accordingly, it is preferably vinyl, prop-1- or -2-enyl, but-1-, -2- or -3-enyl, pent-1-, -2-, -3- or -4-enyl, hex-1-, -2-, -3-, -4- or -5-enyl, hept-1-, -2-, -3-, -4-, -5- or -6-enyl. If the two C atoms of the C=C double bond are substituted, the alkenyl radical can be in the form of E and/or Z isomer (trans/cis). In general, the respective E isomers are preferred. Of the alkenyl radicals, prop-2-enyl, but-2- and -3-enyl, and pent-3- and -4-enyl are particularly preferred.

Herein alkynyl is taken to mean an alkynyl radical having 2 to 15 C atoms, which is straight-chain or branched and contains at least one C≡C triple bond. 1- and 2-propynyl and 1-, 2- and 3-butynyl are preferred.

In the formulae IA, IB and IC, preferred aryl groups are derived, for example, from the parent structures benzene, naphthalene, tetrahydronaphthalene, 9,10-dihydrophenanthrene, fluorene, indene and indane.

In the formulae IA, IB and IC, preferred heteroaryl groups are, for example, five-membered rings, such as, for example, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole and 1,3,4-thiadiazole, six-membered rings, such as, for example, pyridine, pyridazine, pyrimidine, pyrazine, 1,3,5-triazine, 1,2,4-triazine and 1,2,3-triazine, or condensed rings, such as, for example, indole, isoindole, indolizine, indazole, benzimidazole, benzotriazole, purine, naphthimidazole, benzoxazole, naphthoxazole, benzothiazole, benzofuran, isobenzofuran, dibenzofuran, thieno[2,3b]thiophene, thieno[3,2b]thiophene, dithienothiophene, isobenzothiophene, dibenzothiophene, benzothiadiazothiophene, 2H-chromen (2H-1-benzopyran), 4H-chromene (4H-1-benzopyran) and coumarin (2H-chromen-2-one), or combinations of these groups.

In the formulae IA, IB and IC, preferred cycloaliphatic groups are cyclobutane, cyclopentane, cyclohexane, cyclohexene, cycloheptane, decahydronaphthalene, bicyclo[1.1.1]pentane, bicyclo[2.2.2]octane, spiro[3.3]-heptane and octahydro-4,7-methanoindane.

In the formulae IA, IB and IC, preferred heteroaliphatic groups are tetrahydrofuran, dioxolane, tetrahydrothiofuran, pyran, dioxane, dithiane, silinane, piperidine and pyrrolidine.

$A^1$ and $A^2$, independently of one another and identically or differently on each occurrence, are particularly preferably selected from the following groups:
a) 1,4-phenylene, in which, in addition, one or two CH groups may be replaced by N and in which, in addition, one or more H atoms may be replaced by Y,
b) the group consisting of trans-1,4-cyclohexylene and 1,4-cyclohexenylene, in which, in addition, one or more non-adjacent $CH_2$ groups may be replaced by —O— and/or —S— and in which, in addition, one or more H atoms may be replaced by Y, and
c) the group consisting of 1,3-dioxolane-2,4-diyl, tetrahydrofuran-2,5-diyl, cyclobutane-1,3-diyl, 1,4-bicyclo[2.2.2]octanediyl, piperidine-1,5-diyl and thiophene-2,5-diyl, in which, in addition, one or more H atoms may be replaced by Y, where Y has the meaning indicated above under formula IA and preferably denotes F, Cl, CN or $CF_3$.

In the formula IA, $Sp^A$ preferably denotes a spacer group.

Preferred spacer groups Sp are selected from the formula Sp'-X', so that the radical G-Sp- of formula IA corresponds to the formula G-Sp'-X'—, and so that the radical $D^1$-Sp- of formula IB corresponds to the formula $D^1$-Sp'-X', and so that in case $Z^D$ of formula IC denotes a spacer group the radical $D^1$-$Z^D$— of formula IC corresponds to the formula $D^1$-Sp'-X'—, where
Sp' denotes straight-chain or branched alkylene having 1 to 20, preferably 1 to 12 C atoms, which is optionally mono- or polysubstituted by F, Cl, Br, I or CN and in which, in addition, one or more non-adjacent CH$_2$ groups may each be replaced, independently of one another, by —O—, —S—, —NH—, —NR$^0$—, —SiR$^{00}$R$^{000}$—, —CO—, —COO—, —OCO—, —OCO—O—, —S—CO—, —CO—S—, —NR$^0$—CO—O—, —O—CO—NR$^0$—, —NR$^0$—CO—NR$^0$—, —CH=CH— or —C≡C— in such a way that O and/or S atoms are not linked directly to one another, X' denotes —O—, —S—, —CO—, —COO—, —OCO—, —O—COO—, —CO—NR$^{00}$—, —NR$^{00}$—CO—, —NR$^{00}$—CO—NR$^{00}$—, —OCH$_2$—, —CH$_2$O—, —SCH$_2$—, —CH$_2$S—, —CF$_2$O—, —OCF$_2$—, —CF$_2$S—, —SCF$_2$—, —CF$_2$CH$_2$—, —CH$_2$CF$_2$—, —CF$_2$CF$_2$—, —CH=N—, —N=CH—, —N=N—, —CH=CR$^{00}$—, —CY$^x$=CY$^{x'}$—, —C≡C—, —CH=CH—COO—, —OCO—CH=CH— or a single bond, R$^0$, R$^{00}$ and R$^{000}$ each, independently of one another, denote H or alkyl having 1 to 12 C atoms, and Y$^x$ and Y$^{x'}$ each, independently of one another, denote H, F, Cl or CN.

X' is preferably —O—, —S—, —CO—, —COO—, —OCO—, —O—COO—, —CO—NR$^0$—, —NR$^0$—CO—, —NR$^0$—CO—NR$^0$— or a single bond.

Preferred achiral groups Sp' are —(CH$_2$)$_{p1}$—(CF$_2$)$_{p1}$—(CH$_2$CH$_2$O)$_{q1}$—CH$_2$CH$_2$—, —(CF$_2$CF$_2$O)$_{q1}$—CF$_2$CF$_2$—, —CH$_2$CH$_2$—S—CH$_2$CH$_2$—, —CH$_2$CH$_2$—NH—CH$_2$CH$_2$— or —(SiR$^{00}$R$^{000}$—O)$_{p1}$—, in which p1 is an integer from 1 to 12, q1 is an integer from 1 to 3, and R$^{00}$ and R$^{000}$ have the meanings indicated above.

Particularly preferred achiral groups —X'-Sp'- are —(CH$_2$)$_{p1}$—, —O—(CH$_2$)$_{p1}$—, —(CF$_2$)$_{p1}$—, —O(CF$_2$)$_{p1}$—, —OCO—(CH$_2$)$_{p1}$— and —OC(O)O—(CH$_2$)$_{p1}$—, in which p1 has the meaning indicated above.

Particularly preferred achiral groups Sp' are, for example, in each case straight-chain ethylene, propylene, butylene, pentylene, hexylene, heptylene, octylene, nonylene, decylene, undecylene, dodecylene, octadecylene, perfluoroethylene, perfluoropropylene, perfluorobutylene, perfluoropentylene, perfluorohexylene, perfluoroheptylene, perfluorooctylene, perfluorononylene, perfluorodecylene, perfluoroundecylene, perfluorododecylene, perfluorooctadecylene, ethyleneoxyethylene, methyleneeoxybutylene, ethylenethioethylene, ethylene-N-methyliminoethylene, 1-methylalkylene, ethenylene, propenylene and butenylene.

Particularly preferred groups X' are —O— or a single bond.

Particularly preferred sub-formulae of the formula IA are the sub-formulae IAa to IAf shown below:

  IAa

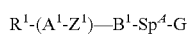  IAb

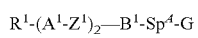  IAc

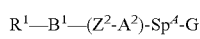  IAd

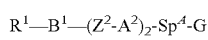  IAe

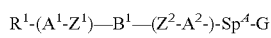  IAf in which R$^1$, A$^1$, A$^2$, B$^1$, Z$^1$, Z$^2$, Sp$^4$ and G have the meanings indicated above and preferably A$^1$ and A$^2$ denote

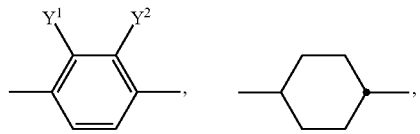

B$^1$ denotes

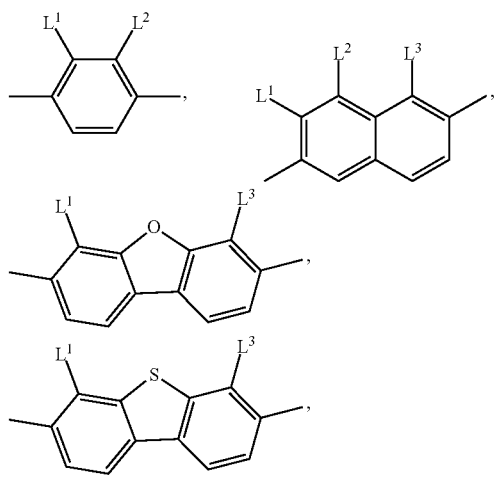

where the groups may be oriented in both directions,

R$^1$ denotes alkyl having 1-15 C atoms, preferably having 1-7 C atoms, in particular CH$_3$, C$_2$H$_5$, n-C$_3$H$_7$, n-C$_4$H$_9$, n-C$_5$H$_{11}$, n-C$_6$H$_{13}$ or n-C$_7$H$_{15}$, or a chiral group R* defined below, L$^1$ and L$^2$, independently of one another, denote CF$_3$, Cl or F, where at least one of the radicals L$^1$ and L$^2$ denotes F, L$^3$ denotes F, Y$^1$ and Y$^2$, independently of one another, denote H, Cl or F, Z$^1$, Z$^2$, independently of one another, denote a single bond, —CF$_2$O—, —OCF$_2$—, —CH$_2$O—, OCH$_2$— or —CH$_2$CH$_2$—, Sp$^4$ denotes unbranched 1,ω-alkylene having 1 to 12 C atoms or a chiral spacer Sp* defined below, G denotes —OH, —SH, —SO$_2$OH, —OP(O)(OH)$_2$, —PO(OH)$_2$, —COH(PO(OH)$_2$)$_2$, —COOH, —Si(OR)$_3$ or —SiCl$_3$, where at least one of R$^1$ and Sp$^4$ is chiral.

Very particularly preferred sub-formulae of the formula IA are the sub-formulae IAa, IAb and IAd.

Examples of preferred compounds of the formulae IAa to IAf are shown below:

IAa-1

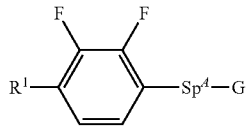

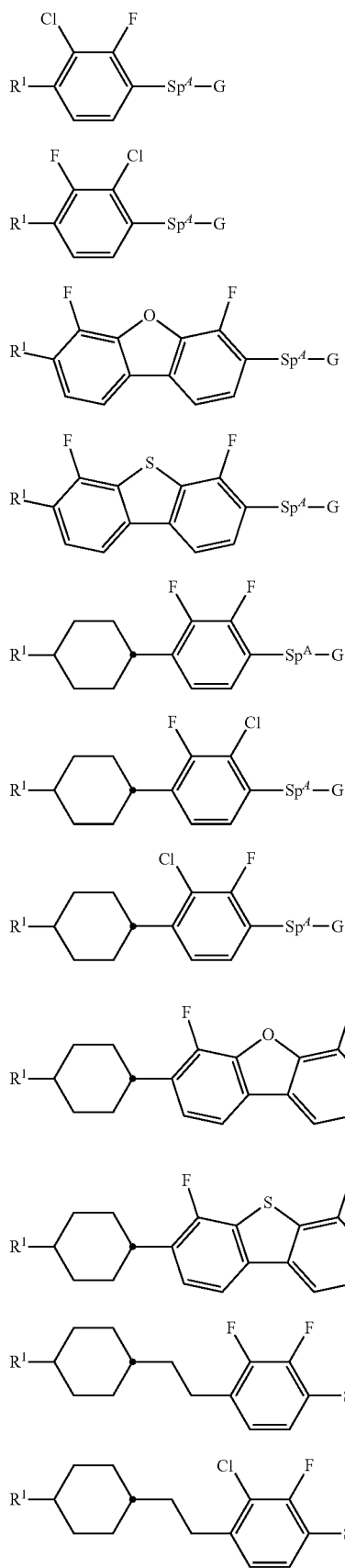
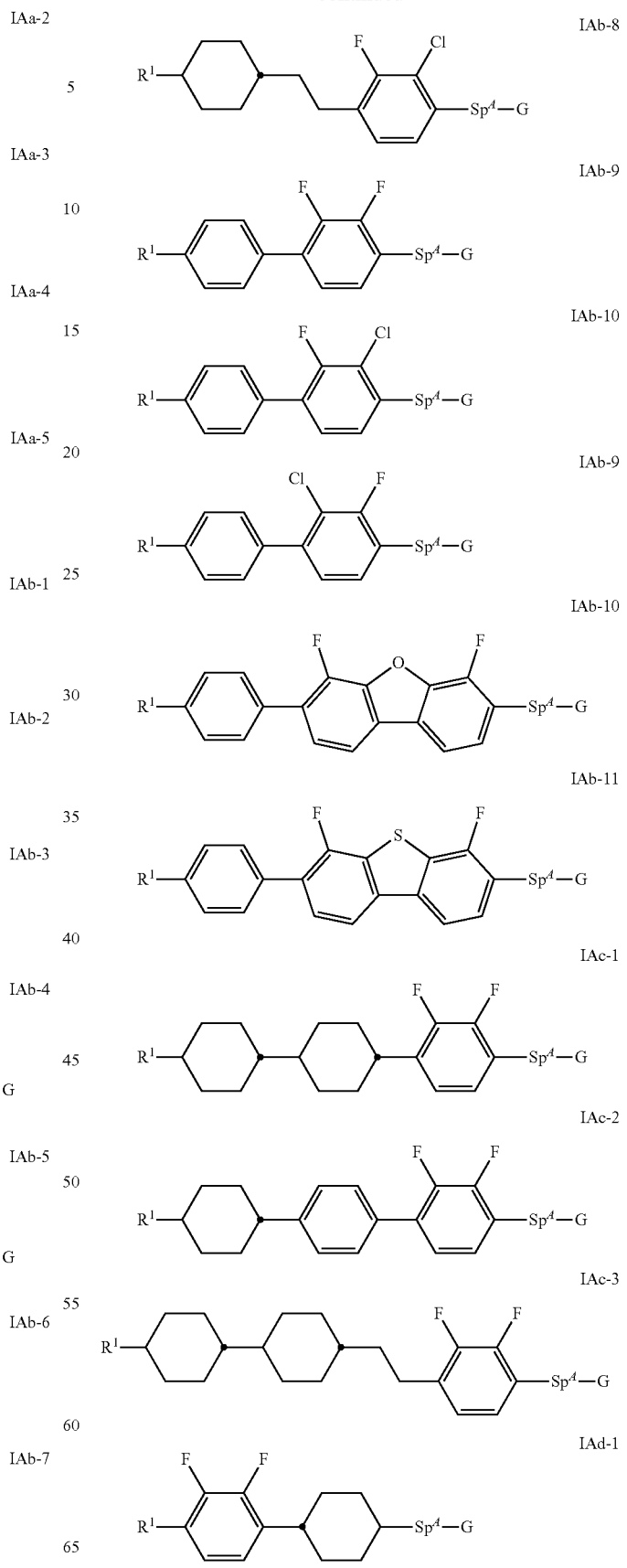

IAd-2
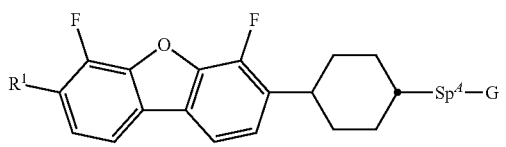

IAd-3
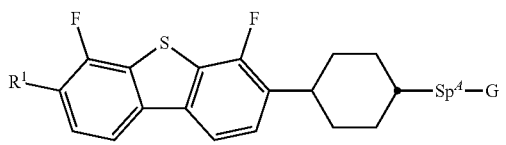

IAd-4
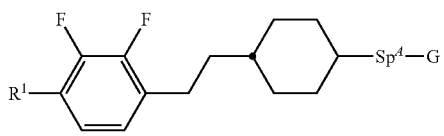

IAd-5
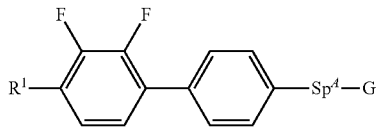

IAd-6
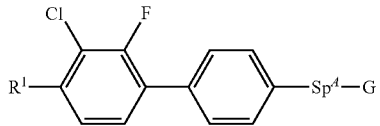

IAd-7
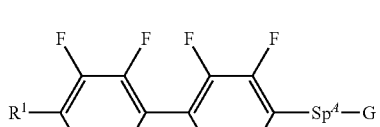

IAd-8
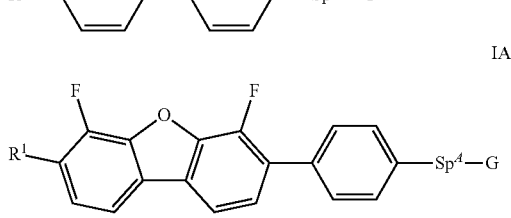

IAd-9
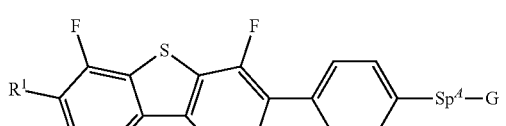

IAe-1
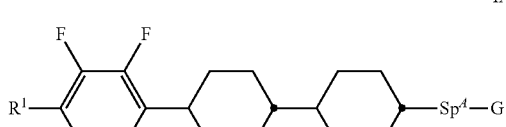

IAe-2
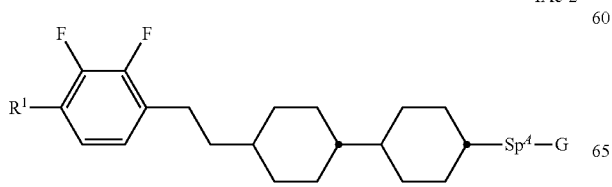

IAe-3
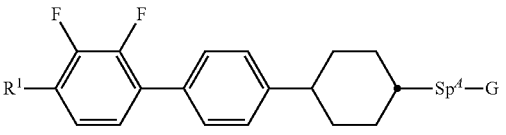

IAe-4
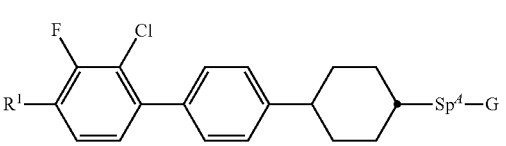

IAe-5
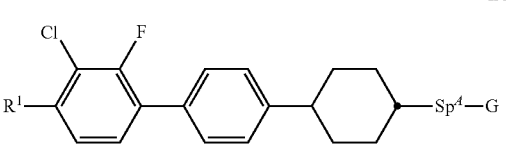

IAf-1
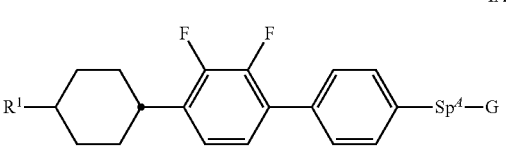

IAf-2
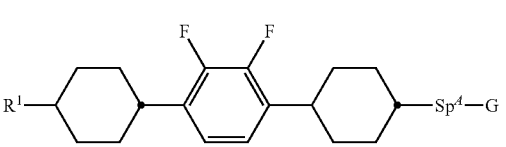

IAf-3
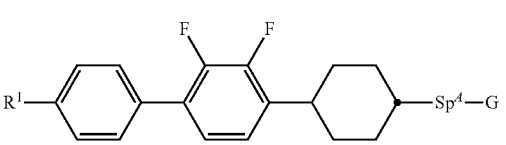

in which $R^1$, $Sp^4$ and G have the meanings given above.

Particularly preferred sub-formulae of the formula IB are the sub-formulae IBa to IBf:

$$D^1\text{-}Z^D\text{—}B^1\text{-Sp-G} \qquad \text{IBa}$$

$$D^1\text{-}Z^D\text{-}(A^1\text{-}Z^1)\text{—}B^1\text{-Sp-G} \qquad \text{IBb}$$

$$D^1\text{-}Z^D\text{-}(A^1\text{-}Z^1)_2\text{—}B^1\text{-Sp-G} \qquad \text{IBc}$$

$$D^1\text{-}Z^D\text{—}B^1\text{—}(Z^2\text{-}A^2)\text{-Sp-G} \qquad \text{IBd}$$

$$D^1\text{-}Z^D\text{—}B^1\text{—}(Z^2\text{-}A^2)_2\text{-Sp-G} \qquad \text{IBe}$$

$$D^1\text{-}Z^D\text{-}(A^1\text{-}Z^1)\text{—}B^1\text{—}(Z^2\text{-}A^2)\text{-Sp-G} \qquad \text{IBf}$$

in which $D^1$, $A^1$, $A^2$, $B^1$, $Z^D$, $Z^1$, $Z^2$, Sp and G have the meanings indicated above.

In formula IB and its sub-formulae, very preferably $A^1$ and $A^2$ identically or differently, denote

B¹ denotes

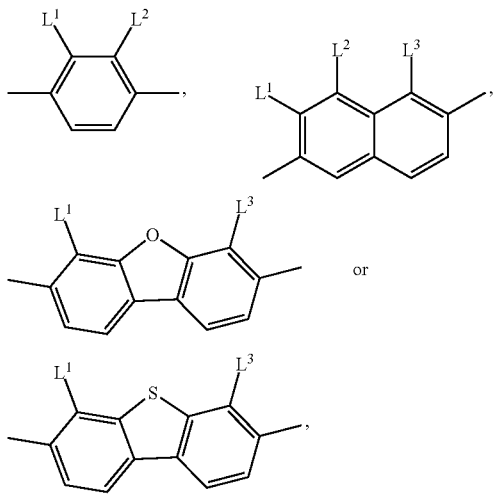

or

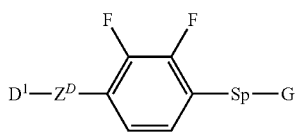

D¹ denotes adamantyl or diamantyl, in particular adamantyl,

L¹ and L², independently of one another, denote CF₃, Cl or F, where at least one of the radicals L¹ and L² denotes F, L³ denotes F, Y¹ and Y², independently of one another, denote H, Cl or F, $Z^D$ denotes a single bond, —C≡C—, —C(O)O—, —OC(O)—, —OCH₂—, —CH₂O—, —CH₂CH₂—, —CH₂CH₂CH₂—, or —CH₂CH₂CH₂CH₂—, preferably —CH₂O—, —C≡C— or a single bond, $Z^1$, $Z^2$, independently of one another, denote a single bond, —C(O)O—, —OC(O)—, —CF₂O—, —OCF₂—, —CH₂O—, —OCH₂—, —CH₂CH₂—, particularly preferably a single bond, Sp denotes a chiral spacer group Sp* defined below,

G-OP(O)(OH)₂, —PO(OH)₂, —COH(PO(OH)₂)₂.

Very particularly preferred sub-formulae of the formula IB are the sub-formulae IBa, IBb and IBd, in particular the following compounds:

IBa-1

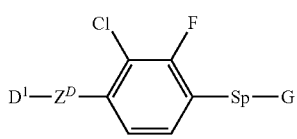
IBa-2

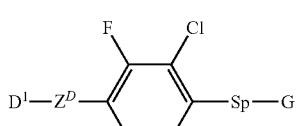
IBa-3

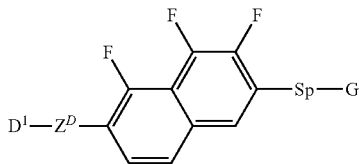
IBa-4

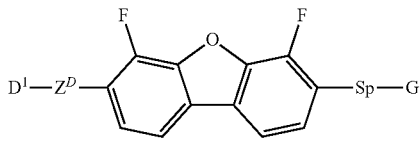
IBa-5

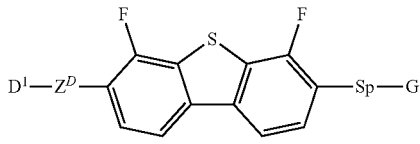
IBa-6

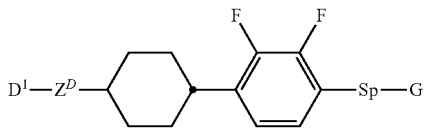
IBa-7

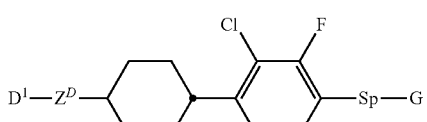
IBa-8

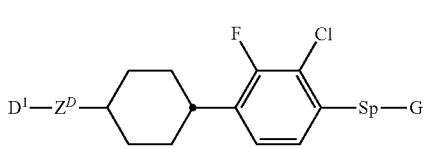
IBa-9

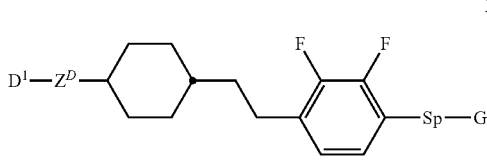
IBa-10

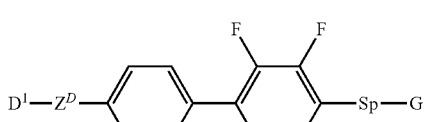
IBa-11

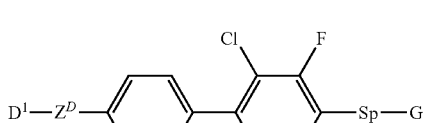
IBa-12

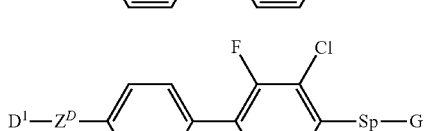
IBa-13

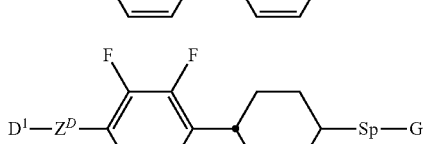
IBb-3

-continued

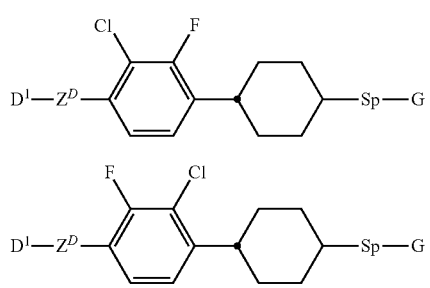

IBb-4, IBb-5, IBb-6, IBb-7, IBb-8, IBb-9, IBb-10, IBb-11 in which $D^1$, $Z^D$, and G have the meanings given above and preferably $D^1$ denotes adamantyl,
$Z^D$ denotes —CH$_2$O—, —C≡C— or a single bond,
G denotes —P(O)(OH)$_2$ or —COH(P(O)(OH)$_2$)$_2$.

In formula IC and its sub-formulae, very preferably
$A^1$ and $A^3$ identically or differently, denote

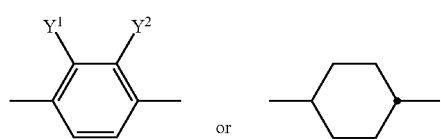

$A^2$-$Z^L$ denotes

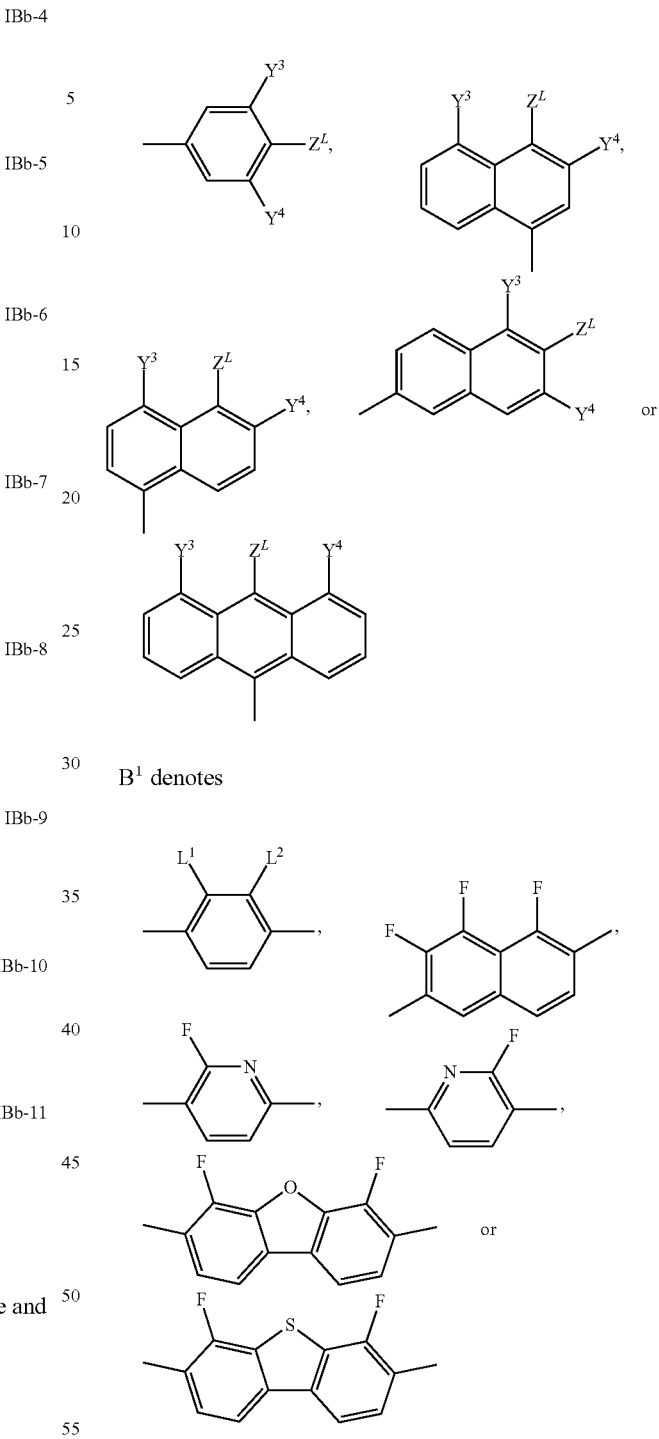

$B^1$ denotes $R^{1C}$ is a chiral group R* defined below,
$L^1$ and $L^2$ identically or differently, denote F, CF$_3$ or Cl,
$Y^1$ and $Y^2$ identically or differently, have one of the meanings given above for Y and preferably denote H, F or Cl,
$Y^3$ and $Y^4$, identically or differently, have one of the meanings given above for $Y^3$ and $Y^4$ and preferably denote methyl, ethyl, isopropyl, cyclopropyl, cyclobutyl, cyclopentyl, cyclopentenyl, cyclohexyl, cyclohexenyl, methoxy, trifluoromethyl, trifluoromethoxy, or trifluoromethylthio $Z^L$ denotes —O—, $Z^1$, $Z^2$, independently of one another, denote a single bond, —C(O)O—, —OC(O)—, —CF$_2$O—, —OCF$_2$—, —CH$_2$O—, OCH$_2$— or —CH$_2$CH$_2$—, in particular a single bond, and G denotes —OP(O)(OH)$_2$, —PO(OH)$_2$, or —COH(PO(OH)$_2$)$_2$.

Very preferred sub-formulae of the formula IC are the sub-formulae IC-1 to IC-6:

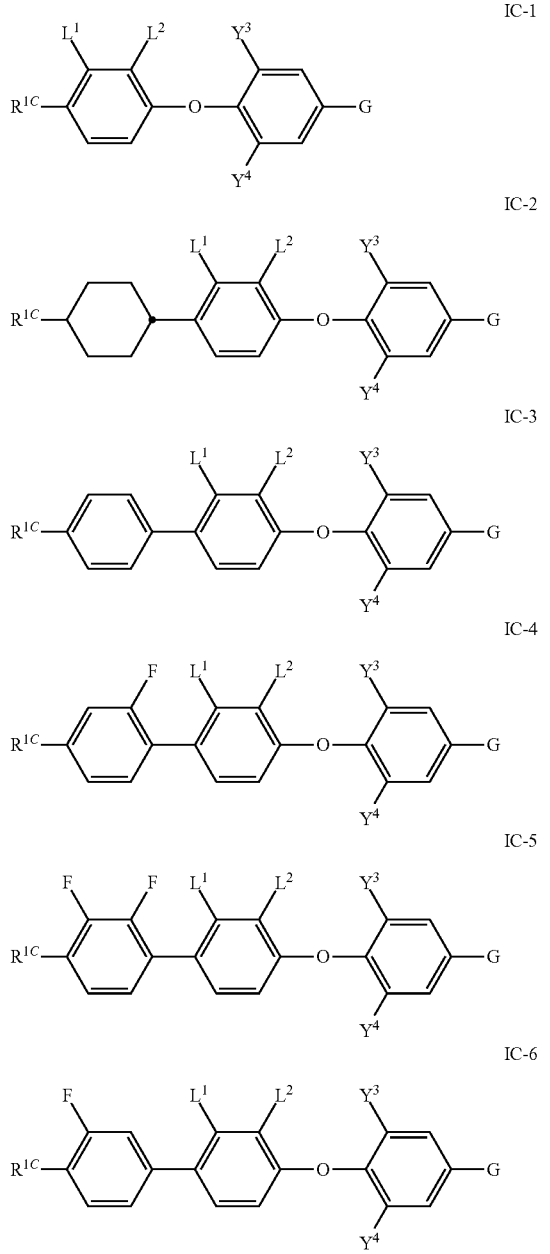

in which $R^{1C}$ has one of the meanings given above, $L^1$ and $L^2$ identically or differently, denote F, CF$_3$, or Cl, $Y^3$ and $Y^4$, identically or differently, have one of the meanings given above and preferably denote methyl, and G denotes —PO(OH)$_2$, or —COH(PO(OH)$_2$)$_2$.

Preferably, the chiral compound has an enantiomeric excess (ee) of above 50%, preferably above 80%, 90%, or 95%, more preferably above 97%, in particular above 98%.

Chirality is achieved by a branched chiral group Sp of formula IA or IB above having one or more, preferably one or two, very preferably one, asymmetrically substituted carbon atom (or: asymmetric carbon atom, C*), above and below referred to as Sp*.

In Sp* the asymmetric carbon atom is preferably linked to two differently substituted carbon atoms, a hydrogen atom and a substituent selected from the group halogen (preferably F, Cl, or Br), alkyl or alkoxy with 1 to 5 carbon atoms in each case, and CN.

The chiral organic radical Sp* preferably has the formula in which

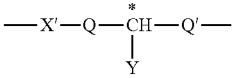

X' has the meanings defined above for formula IA and IB and preferably denotes —CO—O—, —O—CO—, —O—CO—O—, —CO—, —O—, —S—, —CH=CH—, —CH=CH—COO— or a single bond, more preferably —CO—O—, —O—CO—, —O— or a single bond, very preferably —O— or a single bond, Q and Q' identically or differently, denote a single bond or optionally fluorinated alkylene having 1 to 10 carbon atoms, in which a CH$_2$ group not linked with X can also be replaced by —O—, —CO—, —O—CO—, —CO—O— or —CH=CH—, preferably alkylene having 1 to 5 carbon atoms or a single bond, particularly preferably —(CH$_2$)$_{n5}$—, or a single bond, n5 is 1, 2, 3, 4, 5, or 6, Y denotes optionally fluorinated alkyl having 1 to 15 carbon atoms, in which one or two non-adjacent CH$_2$ groups can also be replaced by —O—, —CO—, —O—CO—, —CO—O— and/or —CH=CH—, further CN or halogen, preferably optionally fluorinated alkyl or alkoxy having 1 to 7 C atoms, —CN or Cl, particularly preferably —CH$_3$, —C$_2$H$_5$, —CF$_3$ or Cl, In an embodiment in which $Z^D$ in formula IB is a chiral non-racemic spacer group, the group $D^1$-Sp* preferably has the formula

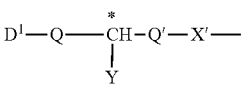

in which the occurring groups have the meanings given above.

Chirality is achieved by a chiral group $R^1$ of formula IA above or by a chiral group $R^{1C}$ of formula IC above, hereinafter referred to as R*, having one or more, preferably one or two, very preferably one, asymmetrically substituted carbon atom(s) (or: asymmetric carbon atom, C*).

In R* the asymmetric carbon atom is preferably linked to two differently substituted carbon atoms, a hydrogen atom and a substituent selected from the group halogen (preferably F, Cl, or Br), alkyl or alkoxy with 1 to 5 carbon atoms in each case, and CN.

The chiral organic radical preferably has the formula

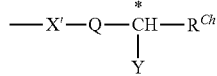

in which

X' has the meanings defined above for formula I and preferably denotes —CO—O—, —O—CO—, —O—CO—O—, —CO—, —O—, —S—, —CH=CH—, —CH=CH—COO— or a single bond, more preferably —CO—O—, —O—CO—, —O—, or a single bond, very preferably —O— or a single bond, Q denotes a single bond or optionally fluorinated alkylene having 1 to 10 carbon atoms, in which a CH$_2$ group not linked with X can also be replaced by —O—, —CO—, —O—CO—, —CO—O— or —CH=CH—, preferably alkylene having 1 to 5 carbon atoms or a single bond, particularly preferably —CH$_2$—, —CH$_2$CH$_2$— or a single bond, Y denotes optionally fluorinated alkyl having 1 to 15 carbon atoms, in which one or two non-adjacent CH$_2$ groups can also be replaced by —O—, —CO—, —O—CO—, —CO—O— and/or —CH=CH—, further CN or halogen, preferably optionally fluorinated alkyl or alkoxy having 1 to 7 C atoms, —CN or Cl, particularly preferably —CH$_3$, —C$_2$H$_5$, —CF$_3$ or Cl, R$^{Ch}$ denotes an alkyl group having 1 to 15 carbon atoms that is different from Y, in which one or two non-adjacent CH$_2$ groups can also be replaced by —O—, —CO—, —O—CO—, —CO—O— and/or —CH=CH—, preferably denotes straight-chain alkyl having 1 to 10, in particular 1 to 7, carbon atoms, in which the CH$_2$ group linked to the asymmetric carbon atom can be replaced by —O—, —O—CO— or —CO—O—.

In an embodiment in which R$^{1C}$ of formula IC denotes a group D$^1$-Z$^D$ as defined above, the group R* has the formula D$^1$-Sp* in which Sp* denotes a chiral non-racemic spacer group.

As described for formula IB, the group D$^1$-Sp* in formula IC preferably has the formula

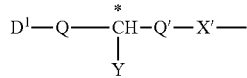

in which Dia, Q, Y and X' have the meanings defined above, and

Q' identically or differently, has the meanings given above for Q.

SYNTHESIS EXAMPLES

Example 1

The synthesis of phosphonic acid PA1 is described in WO 2018/007337 A2

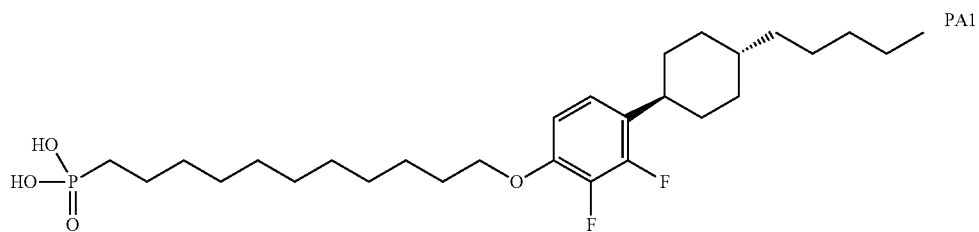 [SMILES: CCCCC[C@H]1CC[C@H](c2ccc(OCCCCCCCCCCCP(=O)(O)O)c(F)c2F)CC1]

Example 2

Step 1: (2S)-3-[2,3-difluoro-4-(4-pentylcyclohexyl)phenoxy]-2-methylpropan-1-ol

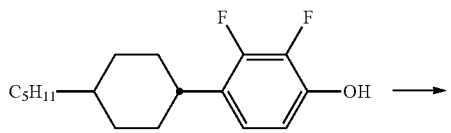

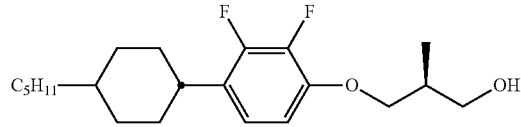

2,3-difluoro-4-(4-pentylcyclohexyl)phenol (11.07 g, 39.21 mmol) is dissolved in butanone (144 mL), (R)-3-bromo-2-methylpropan-1-ol (9.00 g, 58.81 mmol) is added, followed by potassium carbonate (21.68 g, 156.8 mmol, 4.0 eq) in one portion and the mixture is heated under reflux overnight. The reaction is filtered, concentrated to dryness and the crude product is recrystallized from acetonitrile to give (2S)-3-[2,3-difluoro-4-(4-pentylcyclohexyl)phenoxy]-2-methyl-propan-1-ol as colourless crystals.

$^1$H NMR (400 MHz, DMSO-d$_6$) δ ppm 0.85 (3H, t, J=7.0 Hz), 0.93 (3H, d, J=7.0 Hz), 0.96-1.08 (2H, m), 1.12-1.34 (9H, m), 1.43 (2H, qd, J=12.5, 2.2 Hz), 1.67-1.84 (4H, m), 1.92-2.02 (1H, m), 2.61-2.72 (1H, m), 3.35-3.43 (2H, m), 3.86 (1H, dd, J=9.4, 6.4 Hz), 3.99 (1H, dd, J=9.4, 5.9 Hz), 4.60 (1H, t, J=5.3 Hz), 6.88-6.96 (1H, m), 6.96-7.04 (1H, m).

Step 2: 1-[(2R)-3-bromo-2-methyl-propoxy]-2,3-difluoro-4-(4-pentylcyclohexyl)benzene

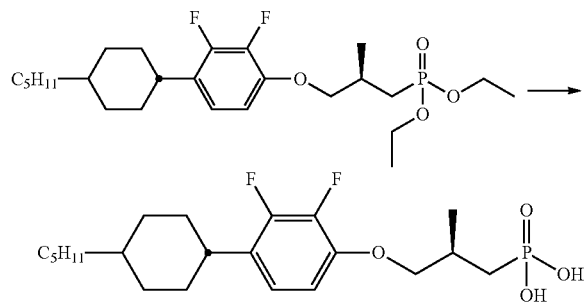

(2S)-3-[2,3-difluoro-4-(4-pentylcyclohexyl)phenoxy]-2-methyl-propan-1-ol (8.16 g, 23.02 mmol) is dissolved in dichloromethane (82.0 mL) and triphenylphosphine (6.64 g, 25.32 mmol, 1.1 eq) is added under nitrogen. The solution is cooled with ice and carbon tetrabromide (8.40 g, 25.32 mmol,) is added portionwise over 10 minutes. The cooling is removed and the solution is allowed to warm to room temperature. After 4 hours triphenylphosphine (0.60 g) and carbon tetrabromide (0.76 g) are added and the solution is stirred at room temperature overnight. The reaction mixture is concentrated to dryness, heptane (175 mL) is added and stirred at 50° C. for 1 hour and the solids are filtered off and washed with heptane (2×125 mL). The filtrates are concentrated to dryness and the suspension is filtered through silica to give 1-[(2R)-3-bromo-2-methyl-propoxy]-2,3-difluoro-4-(4-pentylcyclohexyl)benzene as a colourless oil.

$^1$H NMR (400 MHz, CDCl$_3$) δ ppm 0.91 (3H, t, J=7.0 Hz), 1.01-1.14 (2H, m), 1.16 (3H, d, J=6.8 Hz), 1.19-1.38 (9H, m), 1.44 (2H, qd, J=12.8, 3.3 Hz), 1.80-1.92 (4H, m), 2.29-2.41 (1H, m), 2.75 (1H, tt, J=12.2, 2.9 Hz), 3.57 (1H, dd, J=10.0, 5.3 Hz), 3.62 (1H, dd, J=10.0, 5.2 Hz), 3.95-4.00 (2H, m), 6.65-6.75 (1H, m), 6.81-6.91 (1H, m).

Step 3: 1-[(2R)-3-diethoxyphosphoryl-2-methyl-propoxy]-2,3-difluoro-4-(4-pentylcyclohexyl)benzene

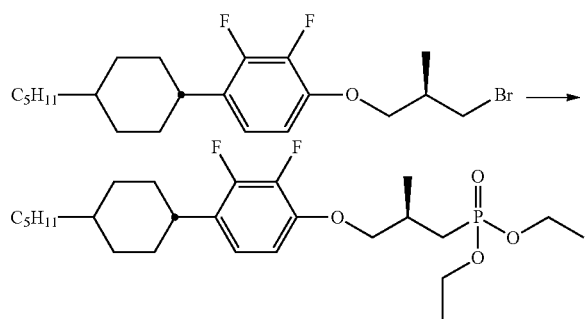

To a solution of diethyl phosphite (4.79 g, 34.72 mmol) in tetrahydrofuran (THF) (69 mL) under nitrogen is added sodium hydride (60%, 1.39 g,) portionwise over 10 minutes and the mixture is stirred at room temperature for 45 min. A solution of 1-[(2R)-3-bromo-2-methyl-propoxy]-2,3-difluoro-4-(4-pentylcyclohexyl)benzene (6.90 g, 16.53 mmol) in THF (69 mL) is added to the mixture over 5 minutes. The mixture is then stirred at reflux overnight. The reaction mixture is added to 10% aq NH$_4$Cl (180 mL) and stirred for 10 min. Methyl-tert.-butyl ether (300 mL) is added and the layers separated. The organics are dried over MgSO$_4$ and concentrated to dryness to give an oil which is purified on silica eluting with ethyl acetate (0-10%)/dichloromethane to give 1-[(2R)-3-diethoxyphosphoryl-2-methyl-propoxy]-2,3-difluoro-4-(4-pentylcyclohexyl)benzene as a pale yellow oil $^1$H NMR (400 MHz, CDCl$_3$) δ ppm 0.89 (3H, t, J=7.0 Hz), 0.99-1.13 (2H, m), 1.15-1.51 (19H, m), 1.70 (1H, ddd, J=18.4, 15.4, 7.8 Hz), 1.77-1.92 (4H, m), 2.10 (1H, ddd, J=18.9, 15.4, 5.7 Hz), 2.32-2.49 (1H, m), 2.73 (2H, tt, J=12.1, 3.0 Hz), 3.86-3.97 (2H, m), 4.01-4.20 (4H, m), 6.62-6.71 (1H, m), 6.78-6.88 (1H, m).

$^{31}$P NMR (162 MHz, CDCl$_3$) δ ppm 30.77 (s).

Step 4: [(2R)-3-[2,3-difluoro-4-(4-pentylcyclohexyl)phenoxy]-2-methyl-propyl]phosphonic acid

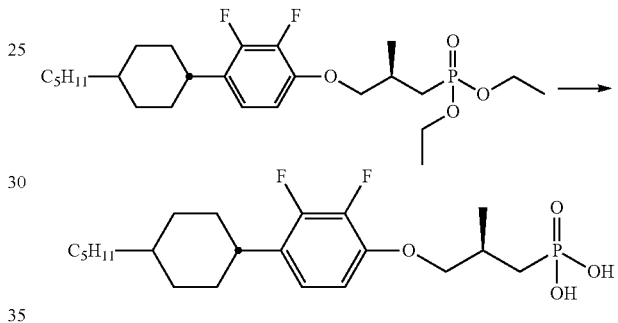

To a solution of 1-[(2R)-3-diethoxyphosphoryl-2-methyl-propoxy]-2,3-difluoro-4-(4-pentylcyclohexyl)benzene (8.70 g, 18.3 mmol) in dichloromethane (131 mL) trimethylsilyl bromide (24.3 mL, 183 mmol) is added dropwise over 10 minutes and the solution is stirred overnight at room temperature. The reaction mixture is concentrated to dryness to give a yellow waxy solid. The solid is dissolved in dichloromethane (200 mL) and methanol (150 mL) and the dichloromethane is removed slowly at 40° C. under a slight vacuum. The solution is cooled to room temperature and then in the freezer overnight and stirred in an ice/water bath for 1 hr. The precipitate is filtered and dried dry giving an off-white solid. 2M HCl (5 mL) is added to the filtrates and after stirring in an ice/acetone bath for 15 minutes the precipitate is filtered giving a white solid. The two batches of material are combined and recrystallized from acetonitrile (16 vols) and THF (1 vol). The precipitate is filtered and washed with acetonitrile (2×15 mL) and dried to give [(2R)-3-[2,3-difluoro-4-(4-pentylcyclohexyl)phenoxy]-2-methyl-propyl]phosphonic acid as a white solid.

$^1$H NMR (400 MHz, CD$_3$OD) d ppm 0.91 (3H, t, J=7.0 Hz), 1.01-1.14 (2H, m), 1.21 (3H, d, J=6.8 Hz), 1.22-1.40 (9H, m), 1.42-1.56 (2H, m), 1.66 (1H, ddd, J=18.2, 15.3, 8.0 Hz), 1.76-1.94 (4H, m), 2.03 (1H, ddd, J=18.9, 15.3, 5.4 Hz), 2.29-2.46 (1H, m), 2.73 (1H, tt, J=12.2, 3.1 Hz), 3.88-4.03 (2H, m), 6.78-6.88 (1H, m), 6.88-6.98 (1H, m).

$^{19}$F NMR (377 MHz, CD$_3$OD) δ ppm −162.51 (d, J=19.1 Hz), −146.22 (d, J=19.1 Hz).

$^{31}$P NMR (162 MHz, CD$_3$OD) δ ppm 28.44.

Example 3

Step 1: 2,3-difluoro-4-[(2S)-2-methyloctoxy]benzaldehyde

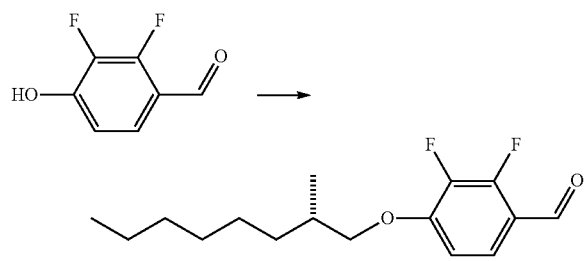

To a solution of 2,3-difluoro-4-hydroxybenzaldehyde (5.84 g, 36.94 mmol) and (S)-2-methyloctyl 4-methylbenzenesulfonate (12.68 g, 42.48 mmol) in dimethylformamide (59 mL) under nitrogen, potassium carbonate (20.42 g, 147.77 mmol, 4.00 eq) is added in one portion. The mixture is heated to 80° C. and stirred overnight. The reaction mixture is cooled, poured onto water (250 mL) and stirred for 5 mins. The mixture is extracted with heptane (2×250 mL) then the organics are combined and washed with water (2×250 mL), dried (MgSO$_4$) and concentrated to dryness giving a yellow oil which purified on silica eluting with dichloromethane (0-20%)/heptane to give 2,3-difluoro-4-[(2S)-2-methyloctoxy]benzaldehyde as a colourless oil.

Step 2: 2,3-difluoro-4-[(2S)-2-methyloctoxy]phenol

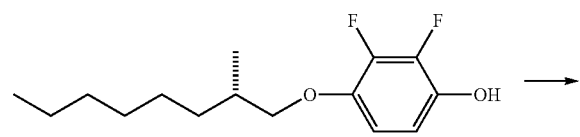

2,3-difluoro-4-[(2S)-2-methyloctoxy]benzaldehyde (9.70 g, 34.11 mmol), dichloromethane (97.0 mL) and mCPBA (70%, 10.51 g, 60.92 mmol) are stirred at 25° C. overnight. The reaction mixture is filtered, the filtrates concentrated to dryness and then re-dissolved in tetrahydrofuran (93 mL). A solution of LiOH·H$_2$O (4.06 g, 96.87 mmol) in water (97 mL) is added to the THF solution in one portion and the solution is stirred at 25° C. for 1 hour. HCl (0.2M, 500 mL) is added portionwise and stirred for 1 hour. The mixture is extracted with MTB ether (2×250 mL) and the combined organics are washed with brine (2×250 mL), dried (MgSO$_4$) and concentrated to dryness giving a beige solid. Heptane (100 mL) is added, stirred for 15 mins, then the solids are filtered off and washed with heptane (3×15 mL). The filtrates were concentrated to dryness giving a brown oil (9.3 g). This is purified on silica eluting with dichloromethane/heptane (0-35%) giving 2,3-difluoro-4-[(2S)-2-methyloctoxy]phenol as a pale yellow oil which crystallised on standing.

$^1$H NMR (400 MHz, DMSO-d$_6$) δ ppm 0.81-0.91 (3H, m), 0.94 (3H, d, J=6.7 Hz), 1.08-1.38 (9H, m), 1.38-1.51 (1H, m), 1.75-1.91 (1H, m), 3.73 (1H, dd, J=9.4, 6.7 Hz), 3.81 (1H, dd, J=9.4, 5.8 Hz), 6.66 (1H, td, J=9.2, 2.2 Hz), 6.78 (1H, td, J=9.2, 2.2 Hz), 9.77 (1H, s).

Step 3: 1-(11-diethoxyphosphorylundecoxy)-2,3-difluoro-4-[(2S)-2-methyloctoxy]benzene

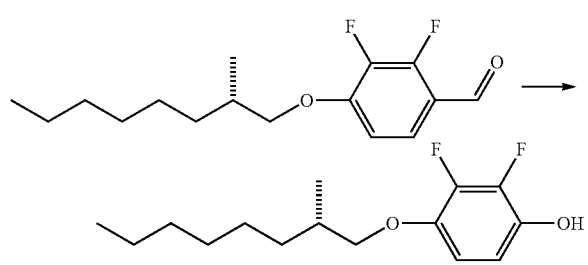

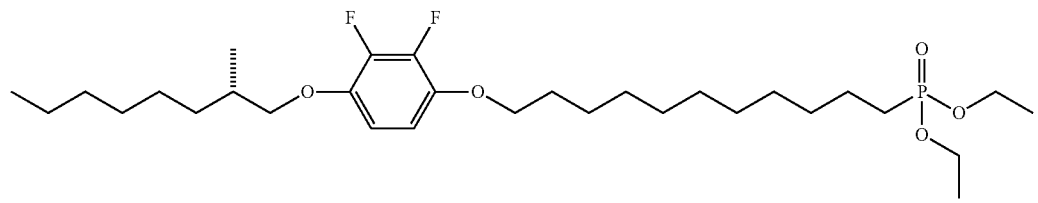

To 2,3-difluoro-4-[(2S)-2-methyloctoxy]phenol (4.95 g, 181.18 mmol) in methylethyl ketone (65 mL) diethyl (11-bromoundecyl)phosphonate (6.75 g, 19.99 mmol) is added followed by potassium carbonate (10.05 g, 72.71 mmol) in one portion. The mixture is heated at reflux overnight, is filtered and concentrated to dryness to give a brown oil which is purified on silica eluting with ethyl acetate (0-20%)/dichloromethane to yield 1-(11-diethoxyphosphorylundecoxy)-2,3-difluoro-4-[(2S)-2-methyloctoxy]benzene.

1H NMR (400 MHz, CDCl$_3$) δ ppm 0.82-0.96 (3H, m), 1.02 (3H, d, J=6.6 Hz), 1.09-1.88 (36H, m), 1.88-1.99 (1H, m), 3.74 (1H, m), 3.83 (1H, dd, J=9.0, 5.8 Hz), 3.97 (2H, t, J=6.5 Hz), 4.03-4.18 (4H, m), 6.61 (2H, m).

$^{31}$P NMR (162 MHz, CDCl$_3$) δ ppm 32.64.

Step 4: 11-[2,3-difluoro-4-[(2S)-2-methyloctoxy]phenoxy]undecylphosphonic acid

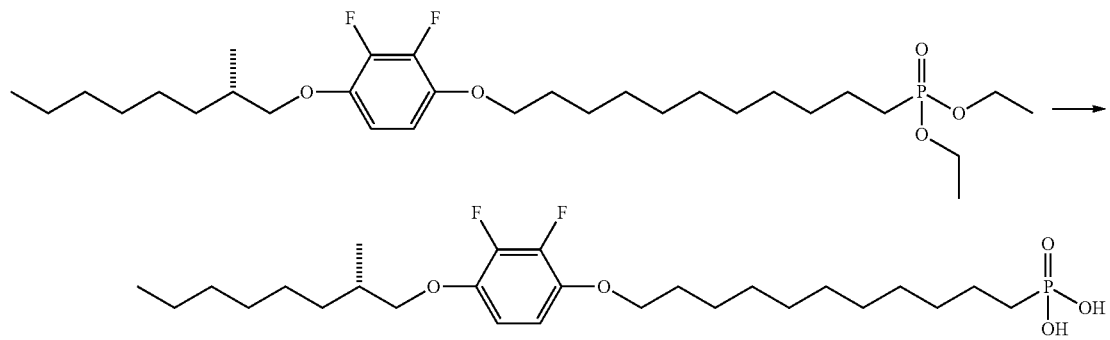

11-[2,3-difluoro-4-[(2S)-2-methyloctoxy]phenoxy]undecylphosphonic acid is obtained from 1-(11-diethoxyphosphorylundecoxy)-2,3-difluoro-4-[(2S)-2-methyloctoxy]benzene by treatment with trimethylsilyl bromide as described above for Example 2, Step 4, as colourless crystals.

$^1$H NMR (400 MHz, CD$_3$OD) δ ppm 0.88-0.98 (3H, m), 1.04 (3H, d, J=6.7 Hz), 1.18-1.74 (28H, m), 1.74-1.83 (2H, m), 1.92 (1H, m), 3.79 (1H, dd, J=9.2, 6.8 Hz), 3.86 (1H, dd, J=9.0, 5.8 Hz), 4.00 (2H, t, J=6.4 Hz), 6.77 (2H, m). $^{19}$F NMR (376 MHz, CD$_3$OD) δ ppm −159.71 (d, J=17.7 Hz), −159.80 (d, J=17.7 Hz).

$^{31}$P NMR (162 MHz, CD$_3$OD) δ ppm 30.16.

In analogy to the above described syntheses the following compounds are obtained:

| Example No. | Compound |
|---|---|
|  | ![structure] |
|  | ![structure] |
|  | ![structure] |
|  | ![structure] |

-continued
| Example No. | Compound |
|---|---|
| | 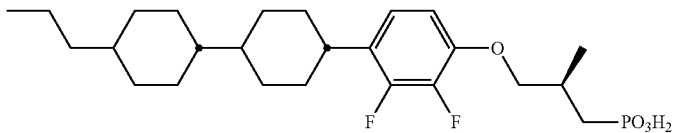 |
| | 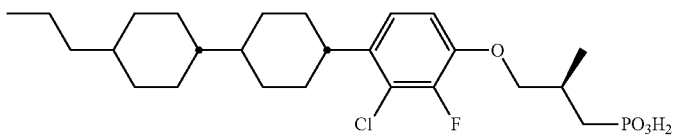 |
| | 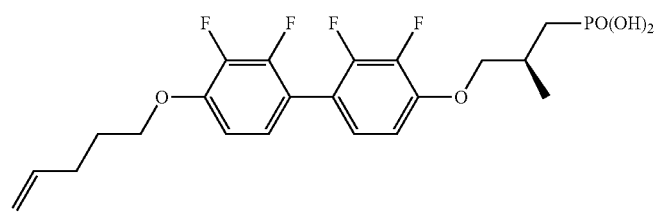 |
| | 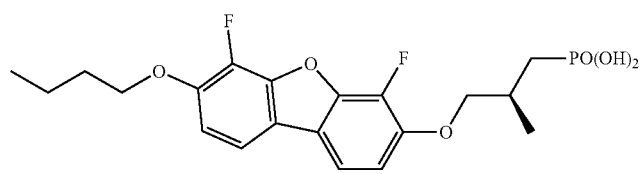 |
| | 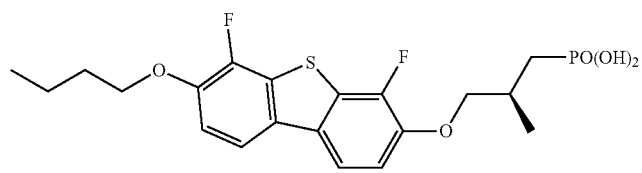 |
| | 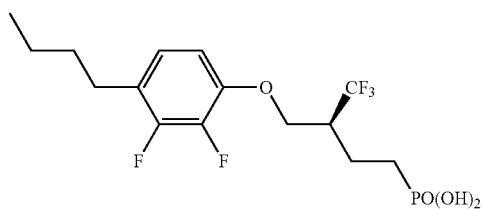 |
| | 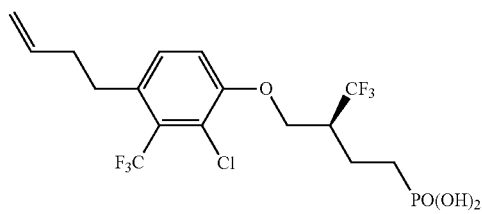 |
| | 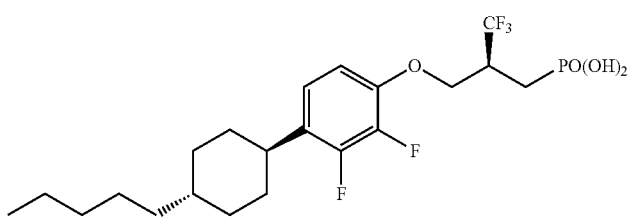 |

| Example No. | Compound |
|---|---|
| | 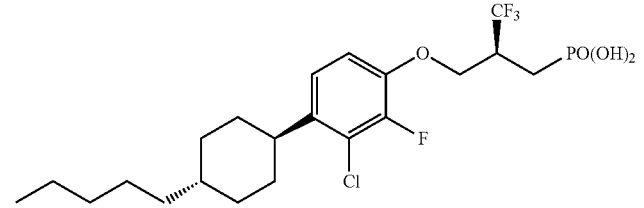 |
| | 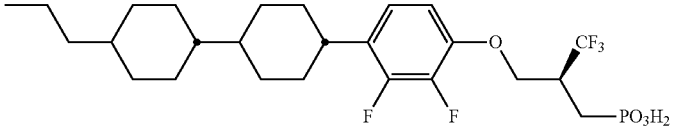 |
| | 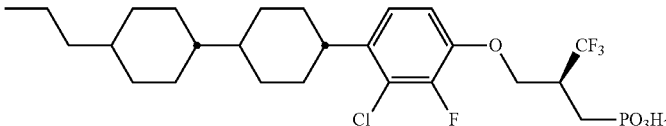 |
| | 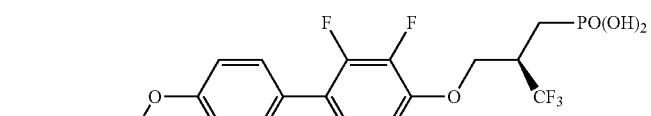 |
| | 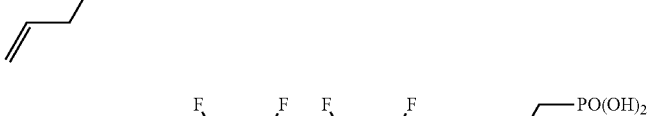 |
| | 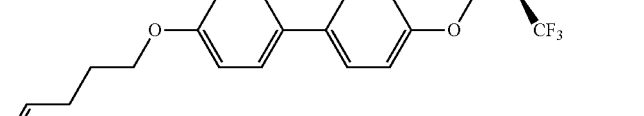 |
| | 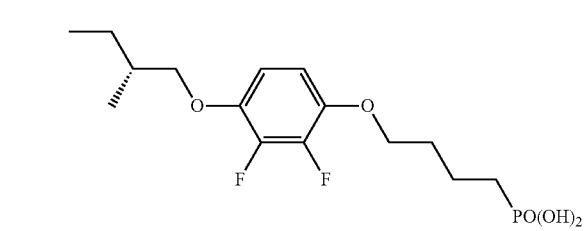 |
| | 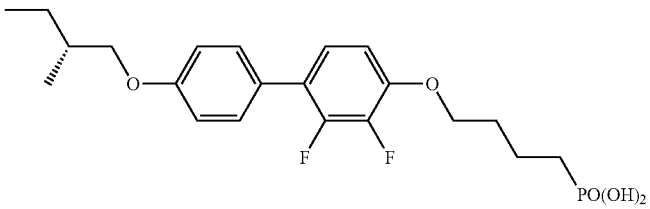 |

| Example No. | Compound |
|---|---|

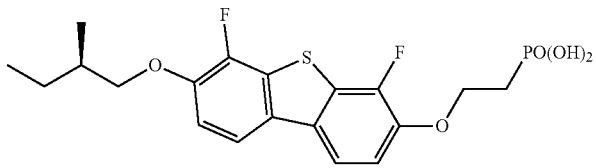

It is a further object of the invention to provide a method for operating of the described two-bit memory device.

In the proposed method, for switching of the molecular layer (C) into a first state of electrical resistance the bottom layer (A) is set to a first electrical potential and the top layer (E) is set to a second electrical potential, where the absolute value of the voltage between the bottom layer (A) and the top layer (E) is greater than a first switching voltage and the first potential is greater than the second potential, and for switching of the molecular layer (C) into a second state of electrical resistance the bottom layer (A) is set to a third electrical potential and the top layer (E) is set to a fourth electrical potential, where the absolute value of the voltage between the bottom layer (A) and the top layer (E) is greater than a second switching voltage and the fourth potential is greater than the third potential.

The absolute values of the first and second switching voltages may be identical so that the first and second switching voltages differ only in their polarity.

Preferably, the state of the two-bit memory device is determined by applying a reading voltage whose absolute value is smaller than the absolute values of the first and second switching voltages between the bottom layer (A) and the top layer (E) and measuring the resulting electrical current.

As the layer structure of the two-bit memory device has at least four distinct states of electrical resistance, the resulting electrical current reflects the different states of electrical resistance. Also, as the difference of the electrical resistance of the two states of the molecular layer (C) and the two states of the top layer (E) differ by at least a factor of 10, the individual states of the molecular layer (C) and of the top layer (E) may be identified by a single current measurement.

The first state of the molecular layer (C) and of the top layer (E) may represent a state of high electrical resistance of the respective layer and likewise the second state of the molecular layer (C) and of the top layer (E) may represent a state of low electrical resistance or vice versa.

For the two-bit memory device according to the first embodiment, for switching of the top layer (E) into a first state of electrical resistance the bottom layer (A) is set to a fifth electrical potential and the top layer (E) is set to a sixth electrical potential, where the absolute value of the voltage between the bottom layer (A) and the top layer (E) is greater than a third switching voltage and the fifth potential is greater than the sixths potential, and for switching of the top layer (E) into a second state of electrical resistance the bottom layer (A) is set to a sevenths electrical potential and the top layer (E) is set to an eights electrical potential, where the absolute value of the voltage between the bottom layer (A) and the top layer (E) is greater than a fourth switching voltage and the eights potential is greater than the sevenths potential, and wherein the absolute values of the third switching voltage and the fourth switching voltage are larger than the absolute values of the first switching voltage and the second switching voltage so that the state of the top layer (E) and the molecular layer (C) are switched simultaneously to the respective first or second state of resistance and, if the molecular layer (C) is to be switched to a different state, an additional step of switching of the molecular layer (C) is performed after switching of the top layer (E).

In the two-bit memory device of the first embodiment, the magnetic switching of the top layer (E) is performed by means of a spin polarized current. For generating this spin-polarized current, a voltage is applied between the bottom layer (A) and the top layer (E). However, due to this voltage an electric field is also applied to the molecular layer (C) and may cause switching of the resistance state of the molecular layer (C) similar to the described dielectric switching. Thus, after the state of the top layer (E) has been set using the third or fourth switching voltage, respectively, which have an absolute value which is higher than the absolute value of the first and second switching voltages, a further switching step may be performed when required, wherein the first or second switching voltage is applied to set the resistance state of the molecular layer (C) after the resistance state of the top layer (E) has been set.

For the two-bit memory device according to the second embodiment, for switching of the top layer (E) into a first state of electrical resistance a first switching current is supplied to the electrical conductor being arranged parallel to the top layer (E) by applying a ninths potential to the first electrical contact and a tenths electrical potential to the second electrical contact, the first electrical potential being greater than the second electrical potential, and for switching of the top layer (E) into a second state of electrical resistance a second switching current is supplied to the electrical conductor being arranged parallel to the top layer (E) by applying an eleventhts potential to the first electrical contact and a twelves electrical potential to the second electrical contact, the twelves electrical potential being greater than the eleventhts electrical potential.

In the two-bit memory device of the second embodiment, magnetic switching of the top layer (E) is performed by means of an external magnetic field generated by the electrical conductor which is arranged parallel to the top layer (E). The respective switching voltages which are required to generate the respective switching current do not apply an electric field to the molecular layer (C) so that the resistance state of the molecular layer (C) is not altered when the resistance state of the top layer (E) is switched.

When setting a state of the two-bit memory device, a voltage having an absolute value of at least the respective switching voltage may be applied in the form of a voltage pulse having a predetermined duration which is sufficient to change the respective state of the device.

The absolute values of first and second switching voltages may be identical. Likewise, the absolute values of third and fourth switching voltages may be identical. Further, the absolute values of the first and second switching currents may be identical.

The two-bit memory device has a magnetic state M and a dielectric state E, which each may be set to "0" or "1" depending on their resistance state. In an example, for switching of the molecular layer (C) into the state $1_E$, a first voltage pulse having the voltage $+V_E$ is used and for switching into the state $0_E$ a second voltage pulse having the voltage $-V_E$ is used. For switching of the top layer (E) into the state $1_M$ a third voltage pulse having the voltage $+V_M$ is used and for switching into the state $0_M$ a fourth voltage pulse having the voltage $-V_M$ is used. Table 1 describes the required voltage pulse sequences for switching from each of the possible four configurations to any of the other possible configurations for a two-bit memory device of the first embodiment.

TABLE 1

|  |  | Target configuration | | | |
|---|---|---|---|---|---|
|  |  | $0_M/0_E$ | $0_M/1_E$ | $1_M/0_E$ | $1_M/1_E$ |
| Initial configuration | $0_M/0_E$ | — | $+V_E$ | $+V_M, -V_E$ | $+V_M$ |
|  | $0_M/1_E$ | $-V_E$ | — | $+V_M, -V_E$ | $+V_M$ |
|  | $1_M/0_E$ | $-V_M$ | $-V_M, +V_E$ | — | $+V_E$ |
|  | $1_M/1_E$ | $-V_M$ | $-V_M, +V_E$ | $-V_E$ | — |

It is a further object of the present invention to provide an electronic component comprising at least one of the described two-bit memory devices.

The electronic component may be configured as a memory device, in particular a non-volatile random access memory device, providing a plurality of storage cells, each storing two bit of information and wherein each storage cell comprises one of the described two-bit memory devices. Additionally or alternatively, the electronic component may be configured as a logic device.

Preferably, the electronic component comprises a crossbar array having word lines and bit lines and a plurality of two-bit memory devices, wherein the word lines are electrically connected to the bottom electrodes of the two-bit memory devices and the bit lines are connected to the top electrodes of the two-bit memory devices.

In such a crossbar array configuration, the bit lines and word lines are usually arranged such that they are rotated by 90° relative to each other so that a cross-shaped arrangement arises. Preferably, a two-bit memory device is arranged at each intersection between a word line and a bit line of the crossbar array.

Preferably, a selector device is assigned to each one of the plurality of two-bit memory devices. A transistor is particularly preferred as selector device. Additionally or alternatively, each of the two-bit memory devices may be coupled to a diode to reduce possible cross-talk between several of the devices. If a transistor is used, the transistor is preferably configured as a field effect transistor (FET).

BRIEF DESCRIPTION OF THE DRAWINGS

The drawings show.

FIGS. 1a to 1d show four different embodiments of a layer structure 10 of the two-bit memory device 1, see FIGS. 2 and 3.

Figure 1A:
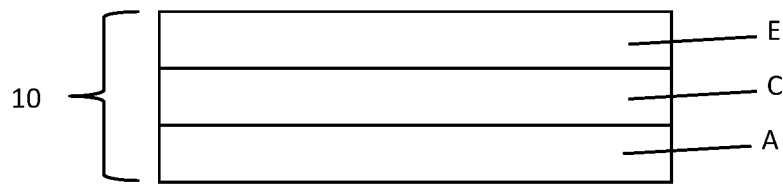
FIGS. 1a to 1d show different embodiments of the layer structure.

The first embodiment of FIG. 1a shows a layer structure 10 consisting of in this order a bottom layer (A), a molecular layer (C) and a top layer (E). The respective layers are in direct contact with each other.

The molecular layer (C) comprises a chiral compound having at least a conformation-flexible molecular dipole moment. Due to the chiral structure, the chiral compound may act as a spin filter for electrons passing through the molecular layer (C). Due to the chiral compound being of flexible conformation, the polar functional group of the molecules of the chiral compound may change its orientation when an electric field is applied. The electrical resistance for a current flowing from the bottom layer (A) through the molecular layer (C) into the top layer (E) is dependent on the orientation of the polar group. Thus, the state of the molecular layer (C) may be changed by applying an electric field.

The molecular layer (C) also serves as spin injector and provides a spin polarized current. Depending on the magnetization of the top layer (E), a spin polarized current flowing from the molecular layer (C) into the top layer (E) exhibits a low or high resistance.

The top layer (E) is electrically conductive and ferromagnetic. The top layer (E) may be magnetized. Depending on the orientation of the magnetization, the state of the top layer (E) may be changed.

The bottom layer (A) of the first embodiment is preferably an electrically conductive material and also serves as a substrate for the chiral compound of the molecular layer (C). For example, a bottom layer made of electrically conductive TiN may be used.

Figure 1B:
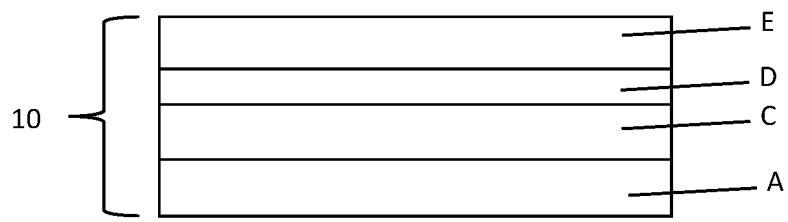

In the second embodiment of FIG. 1b, the layer structure 10 consists of in this order a bottom layer (A), a molecular layer (C), an interlayer (D) and a top layer (E). The respective layers are in direct contact with each other.

The additional interlayer (D) may be used in order to adjust the electrical properties of the layer structure and/or for protection of the molecular layer (C). For example, depending on the electrical properties of the molecular layer (C) an interlayer (D) in the form of an additional electrically insulating layer may be required in order to reduce leakage currents through the layer structure 10. The electrically insulating layer is, for example, an $Al_2O_3$ layer.

Figure 1C:
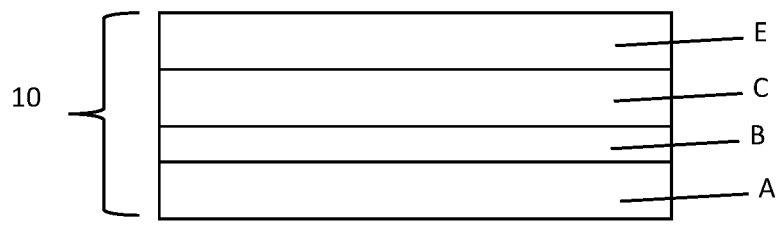

In the third embodiment of FIG. 1c, the layer structure 10 consists of in this order a bottom layer (A), an anchoring layer (B), a molecular layer (C) and a top layer (E). The respective layers are in direct contact with each other.

The anchoring layer (B) serves as substrate for the molecular layer (C) and is not required to be electrically conductive. The anchoring layer (B) may be required for bonding of the molecular layer (C). For example, a thin layer of $Al_2O_3$ may be used as anchoring layer (B). The thin anchoring layer allows electrons from the bottom layer (A) to tunnel into the molecular layer (C) so that a tunnel current may flow. In preferred embodiments, the molecular layer (C) is bonded directly to the bottom layer (A) without the means of an additional anchoring layer (B).

Figure 1D:
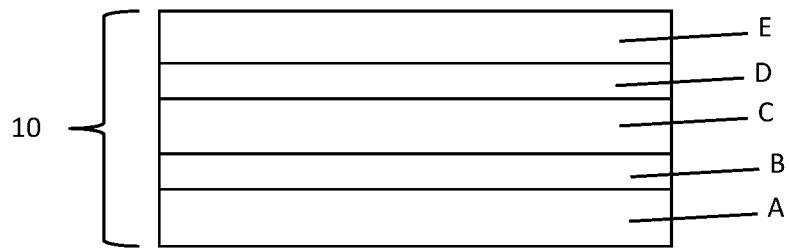

In the fourth embodiment of FIG. 1d, the layer structure 10 consists of in this order a bottom layer (A), an anchoring layer (B), a molecular layer (C), an interlayer (D) and a top layer (E). The respective layers are in direct contact with each other.

Figure 2:
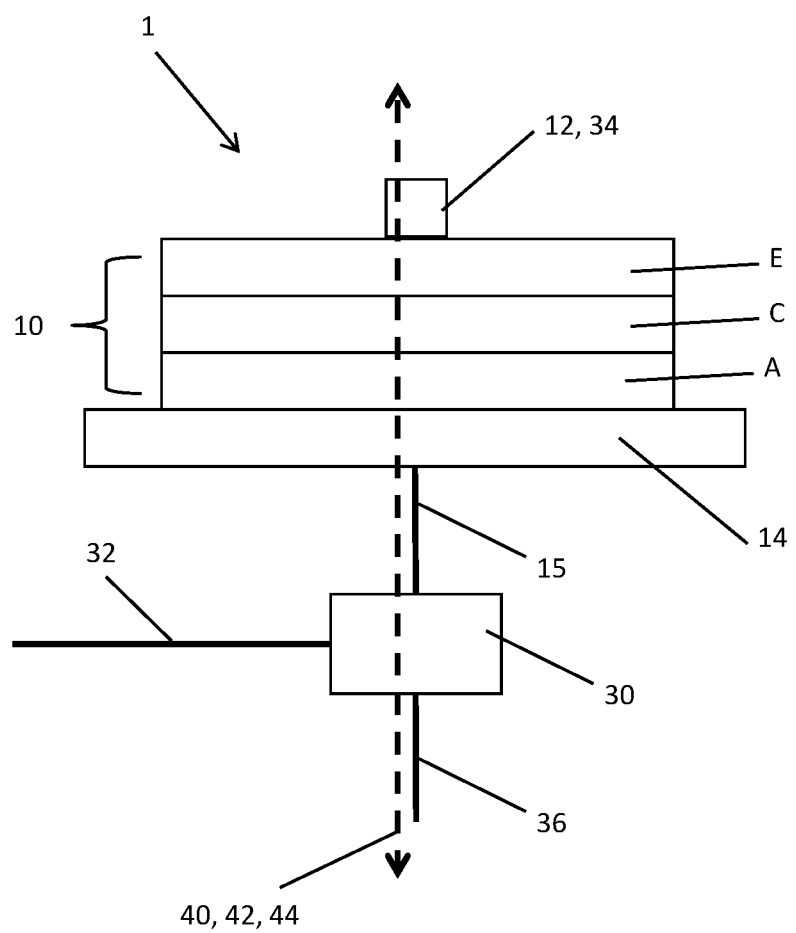
FIG. 2 shows a first embodiment of the two-bit memory device.

FIG. 2 schematically shows a first embodiment of a two-bit memory device 1 comprising a layer structure 10 embedded between a bottom electrode 14 and a top electrode 12.

The layer structure 10 is configured as described with respect to FIG. 1*a* and comprises in this order a bottom layer (A), a molecular layer (C) and a top layer (E). Alternatively, layer structures 10 according to the further embodiments of FIGS. 1*b* to 1*d* may be used.

The bottom electrode 14 is in direct contact with the bottom layer (A) and has an electrical contact 15 which is connected to a selector device 20 which is, for example, configured as a transistor.

The two-bit memory device 1 as shown in FIG. 2 may be embedded in an electronic component comprising a crossbar array. The top electrode 12 serves as bit line 34 of the crossbar array. Further, the selector device 30 is connected to a word line 32 of the crossbar array. By means of the selector device 30, the electrical contact 15 may be connected to a source line 36 depending on a signal on the word line 32.

For reading of the state of the two-bit memory device 1, an electrical current flows according to a read path 40 from the source line 36 through the selector device 30, the electrical contact 15 and the bottom electrode 14 to the layer structure 10. The electrical current flows through the bottom layer (A), the molecular layer (C) and through the top layer (E) and finally into the top electrode 12 or bit line 34.

The electrical resistance of the layer structure 10 for the electrical current running from the bottom layer (A) to the top layer (E) has at least four distinct states which depend on the magnetization of the top layer (E) and on the orientation of the conformation-flexible dipole moment of the chiral compound of the molecular layer (C). Thus, four distinct current levels may be detected which correspond to the four states of the two-bit memory device 1.

For setting of the state of the molecular layer (C), a voltage is applied along a dielectric write path 42 which is identical to the read path 40. Accordingly, a respective switching voltage is applied by means of the top electrode 12 or bit line 34 and the source line 36.

For setting of the state of the top layer (E), a spin polarized current is applied by supplying an electrical current along a magnetic write path 44 which is in the first embodiment identical to the read path 40. Accordingly, current flows from the source line 36 through the selector device 30, the electrical contact 15 and the bottom electrode 14 to the layer structure 10.

The electrical current flows through the bottom layer (A), the molecular layer (C) and through the top layer (E) and finally into the top electrode 12 or bit line 34. The current is spin polarized by means of the molecular layer (C).

Figure 3:
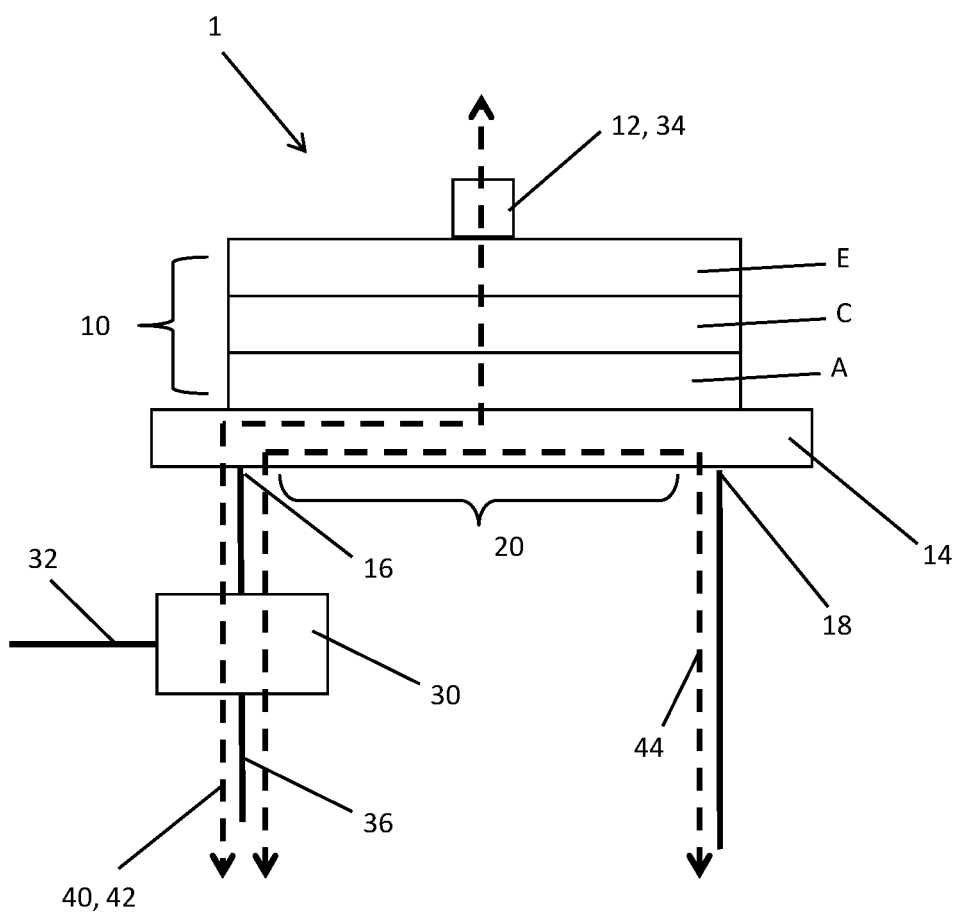
FIG. 3 shows a second embodiment of the two-bit memory device.

FIG. 3 schematically shows a second embodiment of a two-bit memory device 1 comprising a layer structure 10 embedded between a bottom electrode 14 and a top electrode 12.

The layer structure 10 is configured as described with respect to FIG. 1*a* and comprises in this order a bottom layer (A), a molecular layer (C) and a top layer (E). Alternatively, layer structures 10 according to the further embodiments of FIGS. 1*b* to 1*d* may be used.

The bottom electrode 14 is in direct contact with the bottom layer (A) and has a first electrical contact 16 which is connected to a selector device 20 which is, for example, configured as a transistor.

As described with respect to the two-bit memory device 1 of FIG. 2, the two-bit memory device 1 may be embedded in an electronic component comprising a crossbar array. The top electrode 12 serves as bit line 34 of the crossbar array. Further, the selector device 30 is connected to a word line 32 of the crossbar array. By means of the selector device 30, the electrical contact 15 may be connected to a source line 36 depending on a signal on the word line 32.

For reading of the state of the two-bit memory device 1, an electrical current flows according to a read path 40 as described with respect to the first embodiment of FIG. 2.

Also, the setting of the state of the molecular layer (C), is performed as described with respect to the first embodiment of FIG. 2 by applying a voltage along a dielectric write path 42 which is identical to the read path 40.

For setting of the state of the top layer (E), an external magnetic field is generated. For this, a part of the bottom electrode 14 is used as an electrical conductor 20 and an electric current is applied to this electrical conductor 20. For application of the current, the bottom electrode 14 comprises a second electrical contact 18 in addition to the first electrical contact 16.

By applying a voltage difference between the first electrical contact 16 and the second electrical contact 18, a current is generated along a magnetic write path 44 which in turn generates the magnetic field used for switching of the top layer (E).

LIST OF REFERENCE NUMERALS

A bottom layer
B anchoring layer
C molecular layer
D interlayer
E top layer
1 two bit memory device
10 layer structure
12 top electrode
14 bottom electrode
16 first electrical contact
18 second electrical contact
20 electrical conductor
30 selector device
32 word line
34 bit line
36 source line
40 read path
42 write path dielectric state
44 write path magnetic state

The invention claimed is:

1. A two-bit memory device (1) having a layer structure (10), the layer structure (10) comprising in this order
a bottom layer (A),
a molecular layer (C) comprising a chiral compound having at least one polar functional group, and
a top layer (E),
wherein the top layer (E) is electrically conductive and ferro-magnetic,
wherein the chiral compound acts as a spin filter for electrons passing through the molecular layer (C), the chiral compound being of flexible conformation and having a conformation-flexible molecular dipole moment,
and wherein an electrical resistance of the layer structure (10) for an electrical current running from the bottom layer (A) to the top layer (E) has at least four distinct states which depend on the magnetization of the top layer (E) and on the orientation of the conformation-flexible dipole moment of the chiral compound of the molecular layer (C), wherein the chiral compound is of formula (IA), (TB) or (IC)

$$R^1\text{-}(A^1\text{-}Z^1)_r\text{—}B^1\text{—}(Z^2\text{-}A^2)_s\text{-}Sp^A\text{-}G \quad (IA)$$

$$D^1\text{-}Z^D\text{-}(A^1\text{-}Z^1)_r\text{—}B^1\text{—}(Z^2\text{-}A^2)_s\text{-}Sp\text{-}G \quad (IB)$$

$$R^{1C}\text{-}(A^1\text{-}Z^1)_r\text{—}B^1\text{—}Z^L\text{-}A^{2C}\text{-}(Z^3\text{-}A^3)_s\text{-}G \quad (IC)$$

in which $R^1$ denotes straight chain racemic alkyl or alkoxy, each having 1 to 20 C atoms or branched racemic or branched non-racemic alkyl or alkoxy, each having 3 to 20 C atoms, in any of which one or more $CH_2$ groups are optionally replaced, independently of one another, by —C≡C—, —CH=CH—,

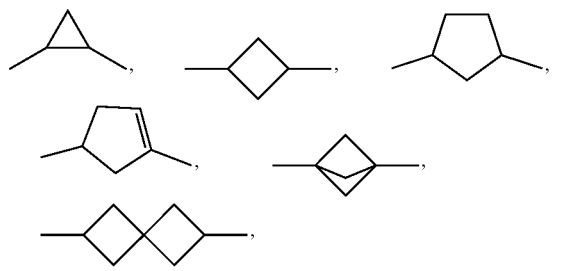

—O—, —S—, —$CF_2$O—, —O$CF_2$—, —CO—O—, —O—CO—, —Si$R^0R^{00}$—, —NH—, —N$R^0$— or —$SO_2$— in such a way that O atoms are not linked directly to one another, and in which one or more H atoms may be replaced by halogen, CN, SCN or $SF_5$, $R^{1C}$ denotes straight chain racemic or alkyl or alkoxy each having 1 to 20 C atoms or branched racemic or branched non-racemic alkyl or alkoxy each having 3 to 20 C atoms, in any of which one or more $CH_2$ groups are optionally replaced, independently of one another, by —C≡C—, —CH=CH—,

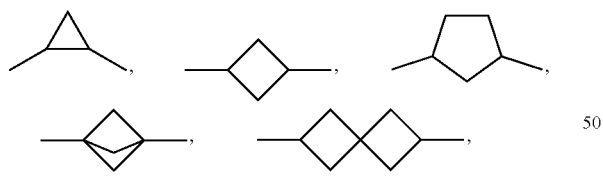

—O—, —S—, —$CF_2$O—, —O$CF_2$—, —CO—O—, —O—CO—, —Si$R^0R^{00}$—, —NH—, —N$R^0$— or —$SO_2$— in such a way that O atoms are not linked directly to one another, and in which one or more H atoms may be replaced by halogen, CN, SCN or $SF_5$, and alternatively denotes a group $D^1$-$Z^D$, $Z^D$ has one of the meanings of $Z^1$, $Z^2$ and $Z^3$ or denotes a spacer group, $Z^1$, $Z^2$, $Z^3$ on each occurrence, identically or differently, denote a single bond, —$CF_2$O—, —O$CF_2$—, —$CF_2$S—, —S$CF_2$—, —$CH_2$O—, —O$CH_2$—, —C(O)O—, —OC(O)—, —C(O)S—, —SC(O)—, —$(CH_2)_{n1}$—, —$(CF_2)_{n2}$—, —$CF_2$—$CH_2$—, —$CH_2$—$CF_2$—, —CH=CH—, —CF=CF—, —CF=CH—, —CH=CF—, —$(CH_2)_{n3}$O—, —O$(CH_2)_{n4}$—, —C≡C—, —O—, —S—, —CH=N—, —N=CH—, —N=N—, —N=N(O)—, —N(O)=N— or —N=C—C=N—, n1, n2, n3, n4 identically or differently, are 1, 2, 3, 4, 5, 6, 7, 8, 9 or 10, $Z^L$ denotes —O—, —S—, —$CH_2$—, —C(O)—, —$CF_2$—, —CHF—, —C($R^x$)$_2$—, —S(O)— or —$SO_2$—, where a group —CHF— or an asymmetrically substituted group —C($R^x$)$_2$— can be racemic or non-racemic, $R^0$, $R^{00}$ identically or differently, denote an alkyl or alkoxy radical having 1 to 15 C atoms, in which one or more H atoms may be replaced by halogen, $R^x$ on each occurrence, identically or differently, denotes H or straight-chain alkyl having 1 to 6 C atoms or branched alkyl having 3 to 6 C atoms, $D^1$ denotes a diamondoid radical, $A^1$, $A^2$, $A^3$ on each occurrence, identically or differently, denote an aromatic, heteroaromatic, alicyclic or heteroaliphatic ring having 4 to 25 ring atoms, which may also contain condensed rings and which may be mono- or polysubstituted by Y, $A^{2C}$ denotes an aromatic or heteroaromatic ring having 5 to 25 ring atoms, which may also contain condensed rings and which may be mono- or polysubstituted by $Y^C$, Y on each occurrence, identically or differently, denotes F, Cl, CN, SCN, $SF_5$ or a straight-chain, in each case optionally fluorinated, alkyl, alkoxy, alkylcarbonyl, alkoxycarbonyl, alkylcarbonyloxy or alkoxycarbonyloxy having 1 to 12 C atoms, or a branched, in each case optionally fluorinated, alkyl, alkoxy, alkylcarbonyl, alkoxycarbonyl, alkylcarbonyloxy or alkoxycarbonyloxy having 3 to 12 C atoms, $Y^C$ on each occurrence, identically or differently, denotes F, Cl, CN, SCN, $SF_5$ or a straight-chain, in each case optionally fluorinated, alkyl, alkoxy, alkylcarbonyl, alkoxycarbonyl, alkylcarbonyloxy or alkoxycarbonyloxy having 1 to 12 C atoms, or a branched, in each case optionally fluorinated, alkyl, alkoxy, alkylcarbonyl, alkoxycarbonyl, alkylcarbonyloxy or alkoxycarbonyloxy having 3 to 12 C atoms or a cycloalkyl or alkylcycloalkyl each having 3 to 12 C atoms, $B^1$ denotes one of the following groups

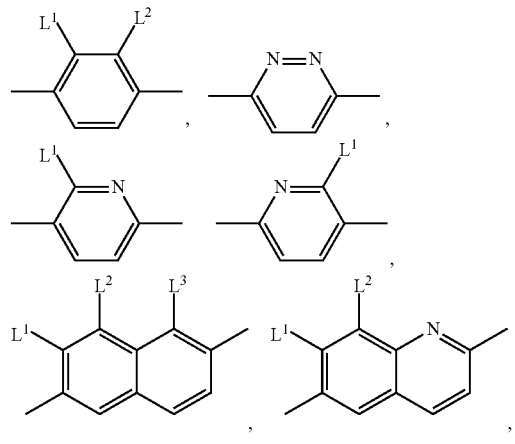

-continued

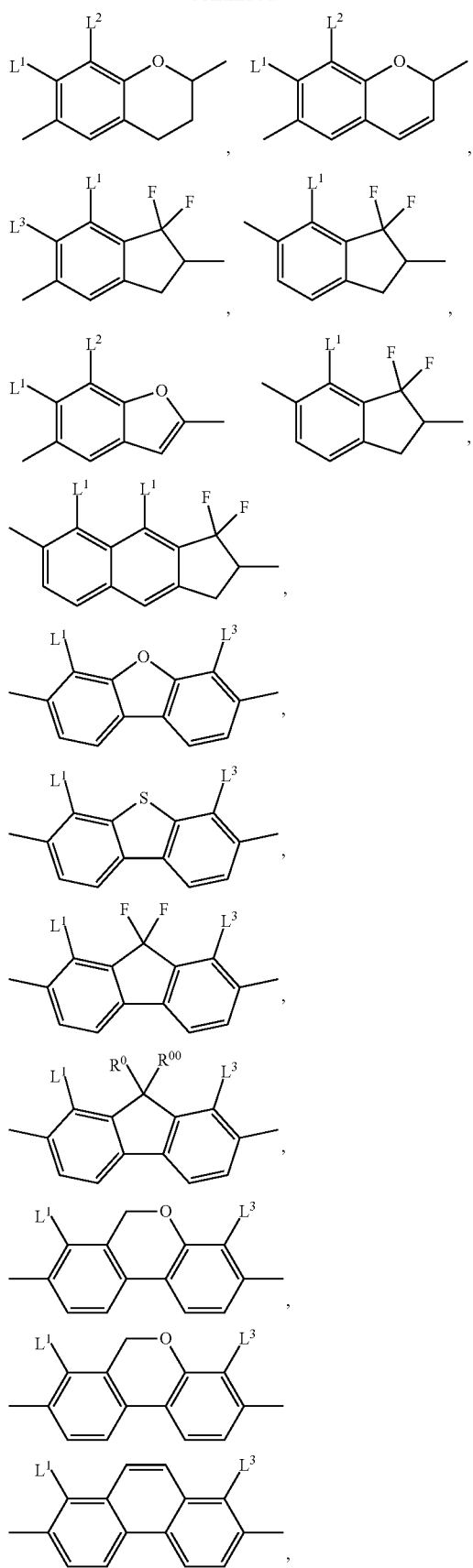

-continued

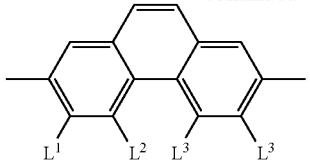

where the group $B^1$ may be oriented in either direction,
$L^1$ to $L^3$ independently of one another, denote F, Cl, Br, I, CN, $SF_5$, $CF_3$ or $OCF_3$, where $L^3$ may alternatively also denote H, $Sp^4$ denotes a spacer group or a single bond, Sp denotes a chiral spacer group, G denotes —OH, —CH(CH$_2$OH)$_2$, —C(CH$_2$OH)$_3$, —SH, —SO$_2$OH, —OP(O)(OH)$_2$, —PO(OH)$_2$, —C(OH)(PO(OH)$_2$)$_2$, —COOH, —Si(OR$^x$)$_3$ or —SiCl$_3$, —SO$_2$OR$^V$, —OP(O)(OR$^V$)$_2$, —PO(OR$^V$)$_2$, —C(OH)(PO(OR$^V$)$_2$)$_2$, —COOR$^V$ or —Si(OR$^V$)$_3$, $R^V$ denotes a secondary or tertiary alkyl having 1 to 20 C atoms, and r, s on each occurrence, identically or differently, are 0, 1 or 2, where at least one of $R^1$ and $Sp^4$ of formula IA is chiral, and at least one of $R^{1C}$ and $Z^L$ of formula IC is chiral, and wherein $B^1$ is polar.

2. The two-bit memory device (1) of claim 1, wherein
the chiral compound of the molecular layer (C) is bound to the bottom layer (A) or
an anchoring layer (B) for bonding of the chiral compound of the molecular layer (C) is arranged between the bottom layer (A) and the molecular layer (C) and the chiral compound of the molecular layer (C) is bound to the anchoring layer (B).

3. The two-bit memory device (1) of claim 1, wherein an interlayer (D) is arranged between the molecular layer (C) and the top layer (E).

4. The two-bit memory device (1) of claim 2, wherein an interlayer (D) is arranged between the molecular layer (C) and the top layer (E) and wherein the material of the anchoring layer (B) and/or of the interlayer (D) is $Al_2O_3$, $ZrO_2$, $HfO_2$, $TiO_2$, $SiO_2$, ITO, AZO, IGZO, ZnO, MgO or a combination thereof.

5. The two-bit memory device (1) of claim 1, wherein the material of the bottom layer (A) is doped Si, and Al, W, Mo, Ru, Ag, Au, TiN, TaN or a combination thereof.

6. The two-bit memory device (1) of claim 1 wherein the material of the top layer (E) is Ni, Co, Fe, NiFe, CoFeB, CoFe, GdFe, TbFeCo, GdFeCo or a combination thereof.

7. The two-bit memory device (1) of claim 1, wherein the molecular layer (C) is a self-assembled monolayer comprising the molecules of the chiral compound.

8. The two-bit memory device (1) of claim 1, wherein the quotient of a difference between the electrical resistances of the two states of the molecular layer (C) and a difference between the two states of the top layer (E) is 10 to 10000.

9. The two-bit memory device (1) of claim 1, wherein, in the chiral compound of formula (IA), (IB) or (IC),
$D^1$ denotes adamantyl, diamantyl or triamantyl, in which one or more H atoms can be replaced by F, in each case optionally fluorinated alkyl, alkenyl or alkoxy having 1 to 12 C atoms.

10. The two-bit memory device (1) of claim 1, wherein the bottom layer (A) is configured as a bottom electrode (14)

or is connected to a bottom electrode (14) and the top layer (E) is connected to a top electrode (12) and for switching of the molecular layer (C) into a first state of electrical resistance or a second state of electrical resistance, a first or second switching voltage is applied between the bottom layer (A) and the top layer (E), and for switching of the top layer (E) into a first state of electrical resistance or a second state of electrical resistance, a third or fourth switching voltage is applied between the bottom layer (A) and the top layer (E), wherein the absolute values of the third and fourth switching voltages are at least two times larger than the absolute values of the first switching voltage and the second switching voltage.

11. The two-bit memory device (1) of claim 1, wherein the bottom layer (A) is configured as a bottom electrode (14) or is contacted by a bottom electrode (14) and the bottom electrode (14) is contacted by a first electrical contact (16) and additionally by a second electrical contact (18) and forms an electrical conductor (20) being arranged parallel to the top layer (E) and the first electrical contact (16) and the second electrical contact (18) are arranged such that an electrical current flows through the electrical conductor (20) when a voltage is applied between the first electrical contact (16) and the second electrical contact (18).

12. A method for operating the two-bit memory device (1) of claim 1, wherein for switching of the molecular layer (C) into a first state of electrical resistance the bottom layer (A) is set to a first electrical potential and the top layer (E) is set to a second electrical potential, where the absolute value of the voltage between the bottom layer (A) and the top layer (E) is greater than a first switching voltage and the first potential is greater than the second potential, and for switching of the molecular layer (C) into a second state of electrical resistance the bottom layer (A) is set to a third electrical potential and the top layer (E) is set to a fourth electrical potential, where the absolute value of the voltage between the bottom layer (A) and the top layer (E) is greater than a second switching voltage and the fourth potential is greater than the third potential.

13. The method for operating the two-bit memory device (1) according to claim 12, wherein the state of the two-bit memory device (1) is determined by applying a reading voltage whose absolute value is smaller than the first and second switching voltages between the bottom layer (A) and the top layer (E) and measuring the resulting electrical current.

14. The method for operating the two-bit memory device (1) according to claim 12, for a two-bit memory device (1)

for switching of the top layer (E) into a first state of electrical resistance the bottom layer (A) is set to a fifth electrical potential and the top layer (E) is set to a sixth electrical potential, where the absolute value of the voltage between the bottom layer (A) and the top layer (E) is greater than a third switching voltage and the fifth potential is greater than the sixth potential, and for switching of the top layer (E) into a second state of electrical resistance the bottom layer (A) is set to a seventh electrical potential and the top layer (E) is set to an eighth electrical potential, where the absolute value of the voltage between the bottom layer (A) and the top layer (E) is greater than a fourth switching voltage and the eighth potential is greater than the seventh potential, and wherein the absolute values of the third switching voltage and the fourth switching voltage are larger than the absolute values of the first switching voltage and the second switching voltage so that the state of the top layer (E) and the molecular layer (C) are switched simultaneously to the respective first or second state of resistance and, if the molecular layer (C) is to be switched to a different state, an additional step of switching of the molecular layer (C) is performed after switching of the top layer (E).

15. The method for operating the two-bit memory device (1) according to claim 12, wherein for a device (1)

for switching of the top layer (E) into a first state of electrical resistance a first switching current is supplied to the electrical conductor being arranged parallel to the top layer (E) by applying a ninth potential to the first electrical contact and a tenth electrical potential to the second electrical contact, the first electrical potential being greater than the second electrical potential, and for switching of the top layer (E) into a second state of electrical resistance a second switching current is supplied to the electrical conductor being arranged parallel to the top layer (E) by applying an eleventh potential to the first electrical contact and a twelfth electrical potential to the second electrical contact, the twelfth electrical potential being greater than the eleventh electrical potential.

16. An electronic component comprising at least one of the two-bit memory device (1) according to claim 1.

17. The electronic component of claim 16, comprising crossbar array having word lines (32) and bit lines (34) and a plurality of two-bit memory devices (1), wherein the word lines (32) are electrically connected to the bottom electrodes (14) of the two-bit memory devices (1) and the bit lines (34) are connected to the top electrodes (12) of the two-bit memory devices (1).

18. The electronic component of claim 17, wherein a selector device (30) is assigned to each one of the plurality of two-bit memory devices (1).

19. A two-bit memory device (1) having a layer structure (10), the layer structure (10) comprising in this order a bottom layer (A), a molecular layer (C) comprising a chiral compound having at least one polar functional group, and a top layer (E), wherein the top layer (E) is electrically conductive and ferro-magnetic, wherein the chiral compound acts as a spin filter for electrons passing through the molecular layer (C), the chiral compound being of flexible conformation and having a conformation-flexible molecular dipole moment, wherein an electrical resistance of the layer structure (10) for an electrical current running from the bottom layer (A) to the top layer (E) has at least four distinct states which depend on the magnetization of the top layer (E) and on the orientation of the conformation-flexible dipole moment of the chiral compound of the molecular layer (C), wherein the bottom layer (A) is configured as a bottom electrode (14) or is connected to a bottom electrode (14) and the top layer (E) is connected to a top electrode (12) and for switching of the molecular layer (C) into a first state of electrical resistance or a second state of electrical resistance, a first or second switching voltage is applied between the bottom layer (A) and the top layer (E), and for switching of the top layer (E) into a first state of electrical resistance or a second state of electrical resistance, a third or fourth switching voltage is applied between the bottom layer (A) and the top layer (E), wherein the absolute values of the third and fourth switching voltages are at least two times larger than the absolute values of the first switching voltage and the second switching voltage.

20. A method for operating a two-bit memory device (1) having a layer structure (10), the layer structure (10) comprising in this order a bottom layer (A), a molecular layer (C) comprising a chiral compound having at least one polar functional group, and a top layer (E), wherein the top layer (E) is electrically conductive and ferro-magnetic, wherein the chiral compound acts as a spin filter for electrons passing through the molecular layer (C), the chiral compound being of flexible conformation and having a conformation-flexible molecular dipole moment, and wherein an electrical resistance of the layer structure (10) for an electrical current running from the bottom layer (A) to the top layer (E) has at least four distinct states which depend on the magnetization of the top layer (E) and on the orientation of the conformation-flexible dipole moment of the chiral compound of the molecular layer (C), wherein in said method for switching of the molecular layer (C) into a first state of electrical resistance the bottom layer (A) is set to a first electrical potential and the top layer (E) is set to a second electrical potential, where the absolute value of the voltage between the bottom layer (A) and the top layer (E) is greater than a first switching voltage and the first potential is greater than the second potential, and for switching of the molecular layer (C) into a second state of electrical resistance the bottom layer (A) is set to a third electrical potential and the top layer (E) is set to a fourth electrical potential, where the absolute value of the voltage between the bottom layer (A) and the top layer (E) is greater than a second switching voltage and the fourth potential is greater than the third potential, for switching of the top layer (E) into a first state of electrical resistance the bottom layer (A) is set to a fifth electrical potential and the top layer (E) is set to a sixth electrical potential, where the absolute value of the voltage between the bottom layer (A) and the top layer (E) is greater than a third switching voltage and the fifth potential is greater than the sixth potential, and for switching of the top layer (E) into a second state of electrical resistance the bottom layer (A) is set to a seventh electrical potential and the top layer (E) is set to an eighth electrical potential, where the absolute value of the voltage between the bottom layer (A) and the top layer (E) is greater than a fourth switching voltage and the eighth potential is greater than the seventh potential, and wherein the absolute values of the third switching voltage and the fourth switching voltage are larger than the absolute values of the first switching voltage and the second switching voltage so that the state of the top layer (E) and the molecular layer (C) are switched simultaneously to the respective first or second state of resistance and, if the molecular layer (C) is to be switched to a different state, an additional step of switching of the molecular layer (C) is performed after switching of the top layer (E).

* * * * *